United States Patent
Ikeuchi et al.

(10) Patent No.: US 6,795,656 B1
(45) Date of Patent: Sep. 21, 2004

(54) OPTICAL TRANSMISSION CIRCUIT USING A SEMICONDUCTOR LASER

(75) Inventors: Tadashi Ikeuchi, Kawasaki (JP); Yuji Tochio, Kawasaki (JP); Toshiyuki Takauji, Sapporo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/526,273

(22) Filed: Mar. 15, 2000

(30) Foreign Application Priority Data

Mar. 29, 1999 (JP) ............................................ 11-085249

(51) Int. Cl.$^7$ ........................... H04B 10/04; H01S 3/00; H01S 3/13
(52) U.S. Cl. ...................... 398/197; 398/182; 398/192; 398/195; 372/38.02; 372/38.07; 372/29.014; 372/29.015
(58) Field of Search ................................. 398/182, 192, 398/193, 195, 197, 2.6, 2.9; 372/38.01, 38.02, 38.07, 29.01, 29.011, 29.014, 29.015

(56) References Cited

U.S. PATENT DOCUMENTS

| | | | |
|---|---|---|---|
| 5,548,435 A | * | 8/1996 | Tahara et al. ................ 398/195 |
| 5,675,600 A | * | 10/1997 | Yamamoto et al. ...... 372/38.01 |
| 5,708,673 A | | 1/1998 | Ikeuchi ......................... 372/38 |
| 6,256,329 B1 | * | 7/2001 | Ishizuka et al. ......... 372/38.02 |

FOREIGN PATENT DOCUMENTS

| | | |
|---|---|---|
| JP | 1-303775 | 12/1989 |
| JP | 4-115583 | 4/1992 |
| JP | 9-246646 | 9/1997 |
| JP | 9-307505 | 11/1997 |
| JP | 10-173600 | 6/1998 |

* cited by examiner

Primary Examiner—M. R. Sedighian
(74) Attorney, Agent, or Firm—Staas & Halsey LLP

(57) ABSTRACT

An optical transmission circuit includes: a semiconductor laser; a drive circuit for supplying drive current to the semiconductor laser; a duty changing circuit for changing a duty value of an input data; a converting circuit for supplying a duty control signal to the duty changing circuit in order to adjust the duty value of the input data; and an adjusting circuit for supplying an optical power control signal to the converting circuit and the drive circuit. The adjusting circuit performs an initial setting of an optical power of the semiconductor laser, and the converting circuit performs the initial setting of the duty value so as to have a characteristic opposite to the optical power. According to the above structure, it is possible to realize the duty adjustment and the optical power adjustment by using only one adjusting circuit so that it is possible to achieve a simplified, miniaturized, and low cost optical transmission circuit.

33 Claims, 23 Drawing Sheets

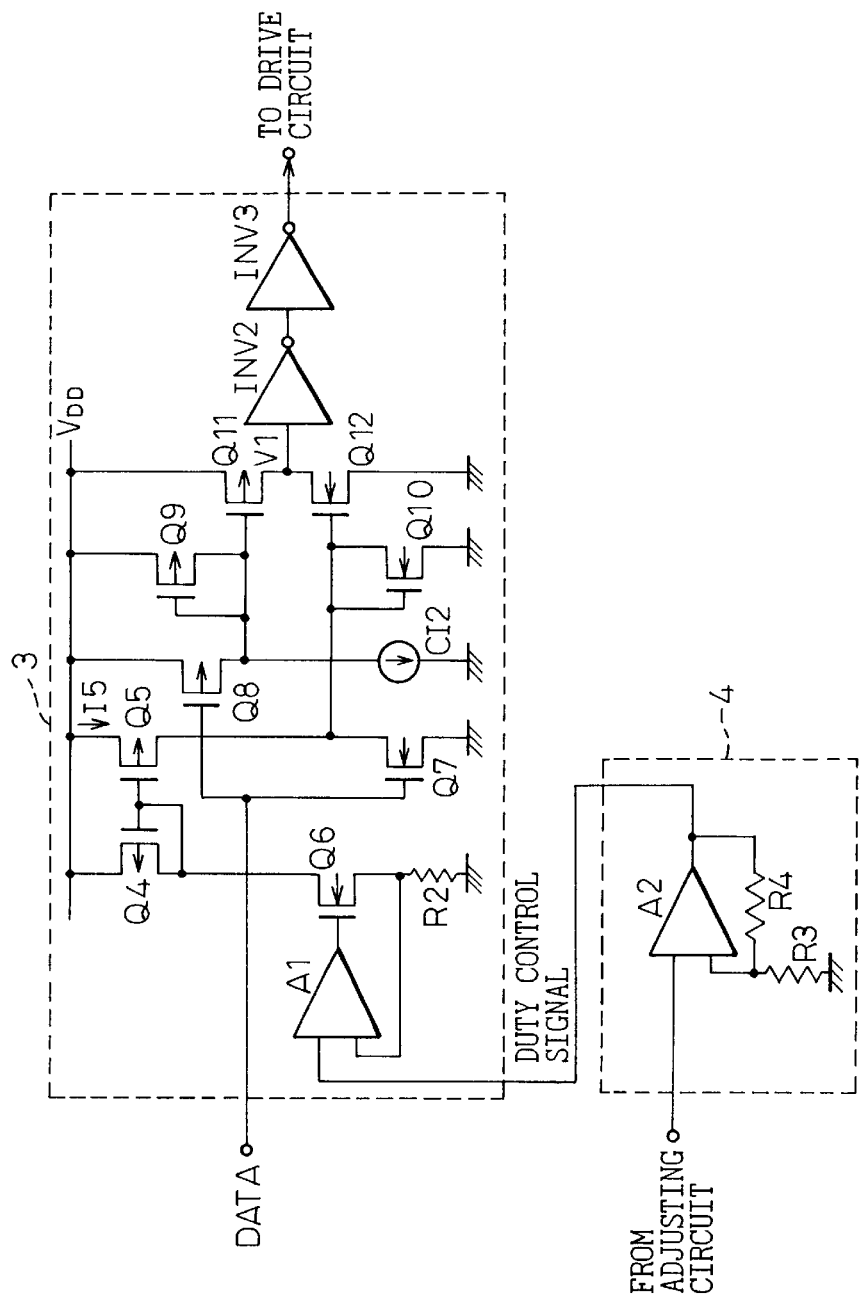

OPTICAL TRANSMISSION CIRCUIT USING A SEMICONDUCTOR LASER

BACKGROUND OF THE INVENTION

1. Field of the Invention

The present invention relates to an optical transmission circuit which includes a semiconductor laser used as a light emitting element and controls the semiconductor laser so as to have a predetermined pulse width and a predetermined optical output power so that it is possible to realize a miniaturized and low cost circuit.

2. Description of the Related Art

Recently, optical fiber cables have been widely provided for subscribers in order to realize a multimedia communications system. In this system, an optical transmission/reception circuit is provided in each subscriber's terminal. In general, an optical transmission circuit for the subscriber is driven in such a way that a bias current of the semiconductor laser is set to zero in order to realize a large extinction ratio Pp/Pb, (where, Pp is an output intensity at a top of a pulse, and Pb is an output intensity at a bottom of the pulse).

In this case, however, when the bias current is set to zero, it is difficult to obtain a desirable optical pulse width due to a delay of oscillation of the semiconductor laser. In general, the delay Td of oscillation can be expressed by the following formula.

$$Td = \tau s \cdot \log(Ip)/(Ip + Ib - Ith) \quad (1)$$

Where, τS is a carrier life time, Ip is a modulation current, Ib is a bias current, and Ith is a threshold current.

As is obvious from the above formula (1), when the bias current Ib is increased, it is possible to reduce the delay Td of oscillation. In this case, however, since the optical transmission circuit for the subscriber is driven in such a manner that the bias current of the semiconductor laser is set to a small value, i.e., approximately zero, in order to realize low power consumption and the large extinction ratio, there is a problem in which the delay Td of oscillation becomes large as is obvious from the above formula (1).

In order to resolve the above problem, i.e., in order to compensate for the above delay of oscillation, there is a known structure which adjusts a duty value of data supplied to a drive circuit of the semiconductor laser. There are, however, further problems, i.e., complicated adjusting processes due to use of two adjusting circuits for performing duty adjustment and optical power adjustment, as explained in detail below.

SUMMARY OF THE INVENTION

The object of the present invention is to provide an optical transmission circuit which can realize the duty adjustment and the optical power adjustment by using only one adjusting circuit so that it is possible to achieve a simplified, miniatuarized, and low cost optical transmission circuit.

In accordance with the present invention, there is provided an optical transmission circuit including: a semiconductor laser; a drive circuit connected to the semiconductor laser for supplying drive current to the semiconductor laser; a duty changing circuit connected to the drive circuit for receiving an input data and changing a duty value of the input data; a converting circuit connected to the duty changing circuit for supplying a duty control signal to the duty changing circuit in order to adjust the duty value of the input data; and an adjusting circuit connected to the converting circuit and the drive circuit for supplying an optical power control signal to these circuits.

In a preferred embodiment, the converting circuit converts the optical power control signal, which is supplied from the adjusting circuit to the converting circuit and the drive circuit, to the duty control signal in order to control the optical power of the semiconductor laser in such a manner that when the optical power is increased, the duty value is decreased.

In another preferred embodiment, the converting circuit comprises an analog-to-digital (A/D) converter which converts the optical power control signal to a digital signal used as an address signal; a memory accessed by the address signal from the A/D converter and for storing the duty control signal in correspondence with the address signal; and a digital-to-analog (D/A) converter which converts a digital duty control signal read out from the memory to an analog duty control signal in order to supply the analog duty control signal to the duty changing circuit.

In still another preferred embodiment, the converting circuit comprises an analog-to-digital (A/D) converter which converts the optical power control signal to a digital signal used as an address signal; a memory accessed by the address signal from the A/D converter and for storing the duty control signal in correspondence with the address signal; and a digital-to-analog (D/A) converter which converts a digital duty control signal read out from the memory to an analog duty control signal in order to supply the analog duty control signal to the duty changing circuit.

In still another preferred embodiment, the optical transmission circuit further comprises a temperature compensating circuit which is provided between the adjusting circuit and the drive circuit in order to compensate for a temperature characteristic of the semiconductor laser.

In still another preferred embodiment, the optical transmission circuit further comprises a temperature compensating circuit which is provided between the adjusting circuit and the duty changing circuit in order to compensate for both the temperature characteristics of the semiconductor laser and the duty changing circuit.

In still another preferred embodiment, the temperature compensating circuit comprises a temperature detecting element, an analog-to-digital (A/D) converter for converting a detection signal detected by the temperature detecting element to a digital signal used as an address signal, and a memory for storing temperature data accessed by the address signal from the A/D converter; and wherein the optical transmission circuit further comprises an analog-to-digital converter (A/D) connected to the adjusting circuit, a multiplier connected to the A/D converter and a digital-to-analog converter (D/A) connected to the multiplier; the A/D converter converts an output of the adjusting circuit to a digital signal; the multiplier multiplys the digital signal by an output of the memory in the temperature compensating circuit; and the D/A converter converts an output of the multiplier to an analog signal in order to obtain the optical power control signal to be supplied to the drive circuit.

In still another preferred embodiment, the optical transmission circuit further comprises a photodiode for monitoring the optical power of the semiconductor laser; and an automatic power control (APC) circuit provided between the photodiode and the drive circuit for detecting current which flows in the photodiode, and to provide the optical power control signal to the drive circuit based on the detected current; wherein the adjusting circuit is connected between the photodiode and the APC circuit in order to perform the initial setting of the current which flows in the photodiode; and the converting circuit converts an output of the adjusting circuit to the duty control signal.

In still another preferred embodiment, the converting circuit comprises an initial value setting unit; a voltage/current converter for converting the current, which flows based on the optical power control signal from the adjusting circuit, to a voltage; and a linkage adjusting unit for outputting the duty control signal based on the initial setting value from the initial value setting unit in correspondence with an output voltage from the voltage/current converter.

In still another preferred embodiment, the converting circuit comprises an initial value setting unit; a voltage/current converter for converting the current, which flows based on the optical power control signal from the adjusting circuit, to a voltage; a power fluctuation compensating unit for detecting fluctuation of power voltage and correcting the output voltage from the voltage/current converter; a voltage/current converter for converting the output voltage of the power fluctuation compensating unit to a current; and a linkage adjusting unit for outputting the duty control signal based on the initial setting value in correspondence with an output voltage of the voltage/current converter.

In still another preferred embodiment, the converting circuit comprises an initial value setting unit; a voltage/current converter for converting the current, which flows based on the optical power control signal from the adjusting circuit, to a voltage; a resistance value control unit for converting the output voltage of the voltage/current converter to a resistance value control signal; and a linkage adjusting unit for outputting the duty control signal based on the initial setting value in correspondence with the resistance value control signal.

In still another preferred embodiment, the duty changing circuit is formed by a clock reference type duty changing circuit which receives input data and clock signals, and adjusts the duty value of the input data to be supplied to the drive circuit in accordance with the duty control signal from the converting circuit.

BRIEF DESCRIPTION OF THE DRAWINGS

FIG. 5A is a detailed circuit of a duty changing circuit and a converting circuit shown in FIG. 1;

DESCRIPTION OF THE PREFERRED EMBODIMENTS

Before describing preferred embodiments, a conventional art and its problem will be explained in detail with reference to a drawing.

Figure 25:
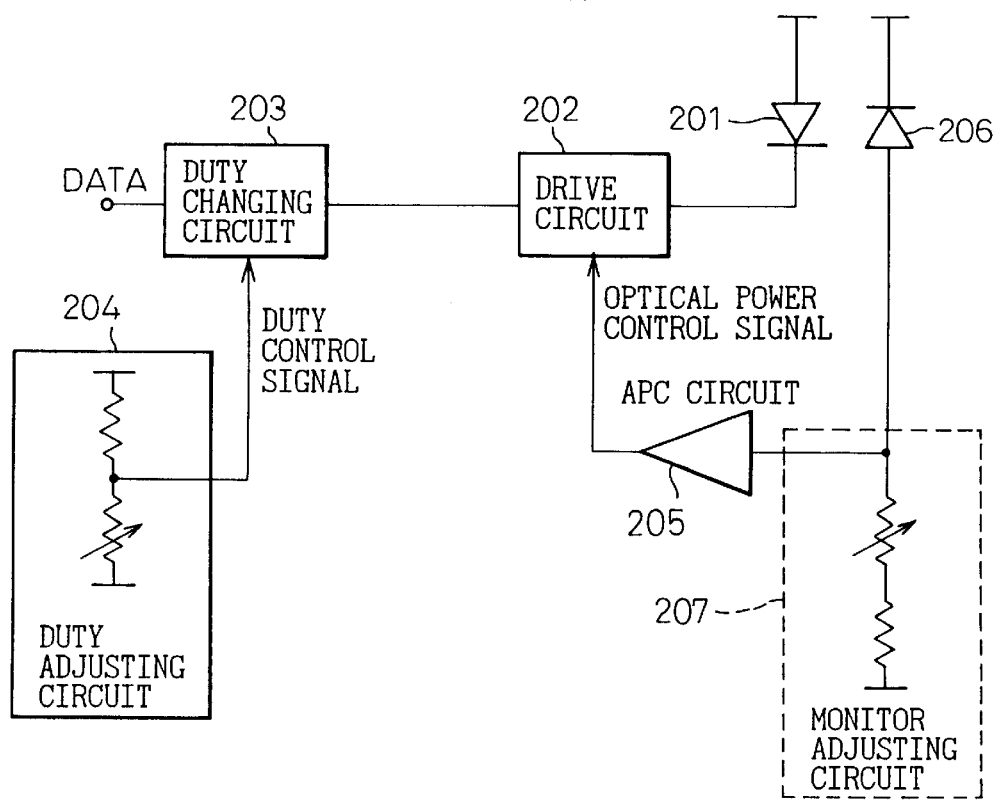
FIG. 25 is a schematic block diagram of an optical transmission circuit in a conventional art.

FIG. 25 is a schematic block diagram of an optical transmission circuit in a conventional art. In FIG. 25, reference number 201 denotes a semiconductor laser, 202 is a drive circuit, 203 is a duty changing circuit for adjusting the above mentioned delay Td of oscillation, 204 is a duty adjusting circuit, 205 is an automatic power control (APC) circuit, 206 is a photodiode, and 207 is a monitor adjusting circuit.

When an input data DATA is supplied to the duty changing circuit 203, the duty value of the input data DATA is adjusted so as to compensate the delay Td of oscillation of the semiconductor laser 201 based on a duty control signal which is obtained by an initial setting operation in the duty adjusting circuit 204 and supplied to the duty changing circuit 203 therefrom. Further, an output signal, in which a duty value of the input data DATA was adjusted, is supplied from the duty changing circuit 203 to the drive circuit 202. The drive circuit 202 outputs a drive current to the semiconductor laser 201 in response to the output signal in which the duty value was adjusted.

The photodiode 206 checks an optical power emitted from the semiconductor laser 201, and outputs the resultant data of the check to the APC circuit 205. That is, when the optical power of the semiconductor laser 201 is increased, a current flowing in the photodiode 206 is also increased so that a voltage, which is converted from the current to the voltage in the monitor adjusting circuit 207, is also increased. The APC circuit 205 detects a change of the voltage at the monitor adjusting circuit 207, and outputs an optical power control signal to the drive circuit 202 in order to reduce the drive current of the semiconductor laser 201. In this case, it is possible to determine the optical power of the semiconductor laser 201 based on an initial setting operation in the monitor adjusting circuit 207.

Further, there is another known structure, for example, U.S. Pat. No. 5,708,673, "An Optical Signal Transmitter", in which the APC circuit 205 is omitted. In this structure, since the optical power of the semiconductor 201 is controlled in accordance with the drive current from the drive current 202, it is necessary to provide another adjusting circuit in order to perform the initial setting operation for the optical power. In this case, another control signal for the optical power based on the above initial setting must be supplied to the drive circuit 202, and the duty value of the input data DATA also must be adjusted in the duty adjusting circuit 204.

As is obvious from the above, there are two representative problems in the conventional art. That is, it is necessary to provide at least two adjusting circuits, i.e., one being the duty adjusting circuit for controlling the output of the duty changing circuit, and the other being the monitor adjusting circuit for adjusting the input to the APC circuit.

Further, in connection with the above two adjusting circuits, it is necessary to provide at least two adjusting points which must be linked with each other, i.e., one being provided to adjust the optical power of the semiconductor laser through the monitor adjusting circuit, and the other being provided to adjust the duty value of the input data DATA in the duty adjusting circuit. As a result of two adjusting points, the optical power adjusting steps become complicated so that a lot of time is required for completing various adjustments of the circuits. Further, since some adjustments must be performed from outside of the circuit, it is difficult to realize a miniaturized and low cost circuit.

Accordingly, the present invention aims to realize simplified adjustment so that it is possible to realize a miniaturized and low cost circuit which can complete the adjustment based on only one step by linking the adjustment of the duty value with the adjustment of the optical power.

The preferred embodiments of the present invention will be explained in detail with reference to the attached drawings.

Figure 1:
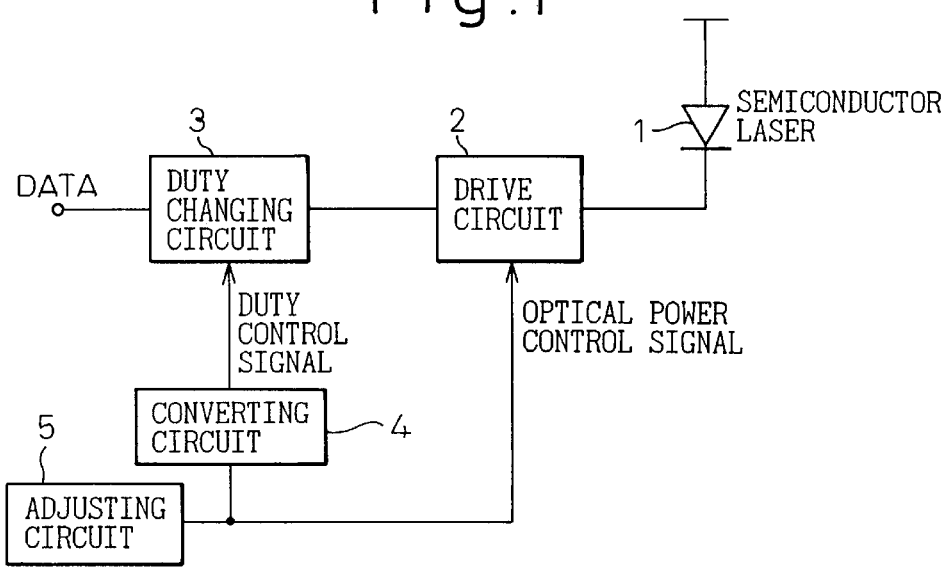
FIG. 1 is a schematic block diagram of an optical transmission circuit according to a first embodiment of the present invention.

FIG. 1 is a schematic block diagram of an optical transmission circuit according to a first embodiment of the present invention. In FIG. 1, reference number 1 is a semiconductor laser, 2 is a drive circuit, 3 is a duty changing circuit, 4 is a converting circuit, and 5 is an adjusting circuit. An input data DATA is supplied to the drive circuit 2 through the duty changing circuit 3 after adjustment of the duty value. Further, a drive current is supplied from the drive circuit 2 to the semiconductor laser 1.

The adjusting circuit 5 determines an initial value for obtaining an optical power control signal, and outputs the optical power control signal to the drive circuit 2 so as to obtain the desired optical power from the semiconductor laser 1. The drive circuit 2 supplies the drive current to the semiconductor laser 1 in response to the optical power control signal. Further, the optical power control signal is supplied in parallel from the adjusting circuit 5 to the converting circuit 4, and the converting circuit 4 outputs a duty control signal to the duty changing circuit 3 in order to control the duty value of the input data DATA. As is obvious from the above, it is possible to adjust the optical power of the semiconductor laser 1 and the duty value of the input data DATA based on only one adjustment in the adjusting circuit 5.

Figure 2:
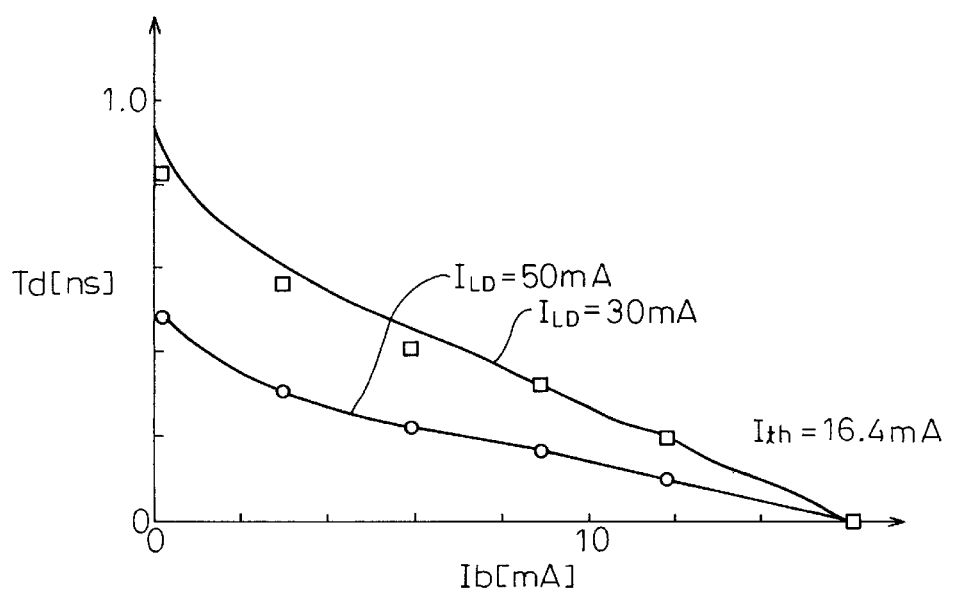
FIG. 2 is a graph for explaining the characteristics of a semiconductor laser.

FIG. 2 is a graph for explaining characteristics of the semiconductor laser. In the graph, an ordinate represents a delay Td (ns) of oscillation of the semiconductor laser, and an abscissa represents a bias current Ib (mA). Further, Ith is a threshold current, and $I_{LD}$ is a drive current. As shown in the graph, when the threshold current Ith is 16.3 mA, the delay Td of oscillation was measured in both cases of the drive current $I_{LD}$=30 mA and 50 mA. In this case, the drive current $I_{LD}$ corresponds to a sum of the bias current Ib and the modulation current Ip (see the formula (1)).

As is obvious from the graph and the formula (1), the delay Td of oscillation of the semiconductor laser can be reduced by increasing the modulation current Ip and the bias current Ib. When a period of the optical power which is supplied to the semiconductor laser is To, the duty value W (%) of the output signal from the duty changing circuit 3 is adjusted based on the following formula.

$$W=(To+Td)/To$$

For example, in order to determine the duty value W of the optical power to 100%, it is obvious that an initial adjustment must be performed based on the above formula in the duty changing circuit 3.

When the modulation current Ip is used for adjusting the optical power, the bias current Ib is set to a constant value. On the other hand, when the threshold current Ith has a small solid dispersion, it is possible to determine the threshold value as a constant value. Accordingly, since the bias current Ib and the threshold current Ith can appear to be constant, the delay Td of oscillation in the formula (1) becomes a function of the modulation current Ip, and this function can be expressed by Td(Ip), i.e., Td=Td(Ip). In this case, the function Td(Ip) always has a negative slope.

On the other hand, the duty value W can be expressed by the following formula from the above formula.

$$W=1+(1/To)Td(Ip)$$

Accordingly, the adjusted duty value W can be expressed by a function which always has the negative slope for the modulation current Ip. The above relationship can be expressed by the following formula.

$$\text{when } Ip \rightarrow \text{increased, then, } Td \rightarrow \text{reduced} \qquad (2)$$

Figure 3:
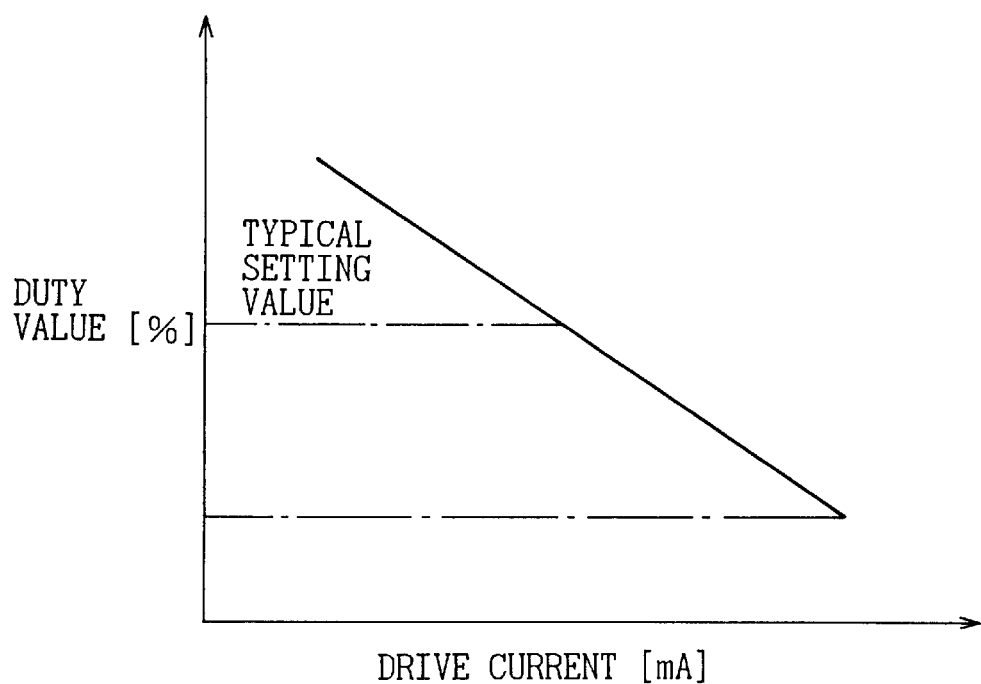
FIG. 3 is a graph for explaining a relationship between a duty value (%) and a drive current (mA)

FIG. 3 is a graph for explaining a relationship between the duty value (%) and the drive current (mA). When the optical power is increased by increasing the drive current $I_{LD}$ which is supplied from the drive circuit 2 to the semiconductor laser 1, the duty value W is set to a value smaller than a typical setting value (see an upper chain dotted line). On the other hand, when the optical power is reduced by reducing the drive current $I_{LD}$, the duty value is set to a value larger than the typical setting value. As explained above, the optical power control signal is sent from the adjusting circuit 5 to the drive circuit 2 and the converting circuit 4, and the duty control signal is added from the converting circuit 4 to the duty changing circuit 3. Further, the relationship between the optical power control signal and the duty control signal is changed by the converting circuit 4 in such a way that the duty value is changed based on the negative slope.

Figure 4:
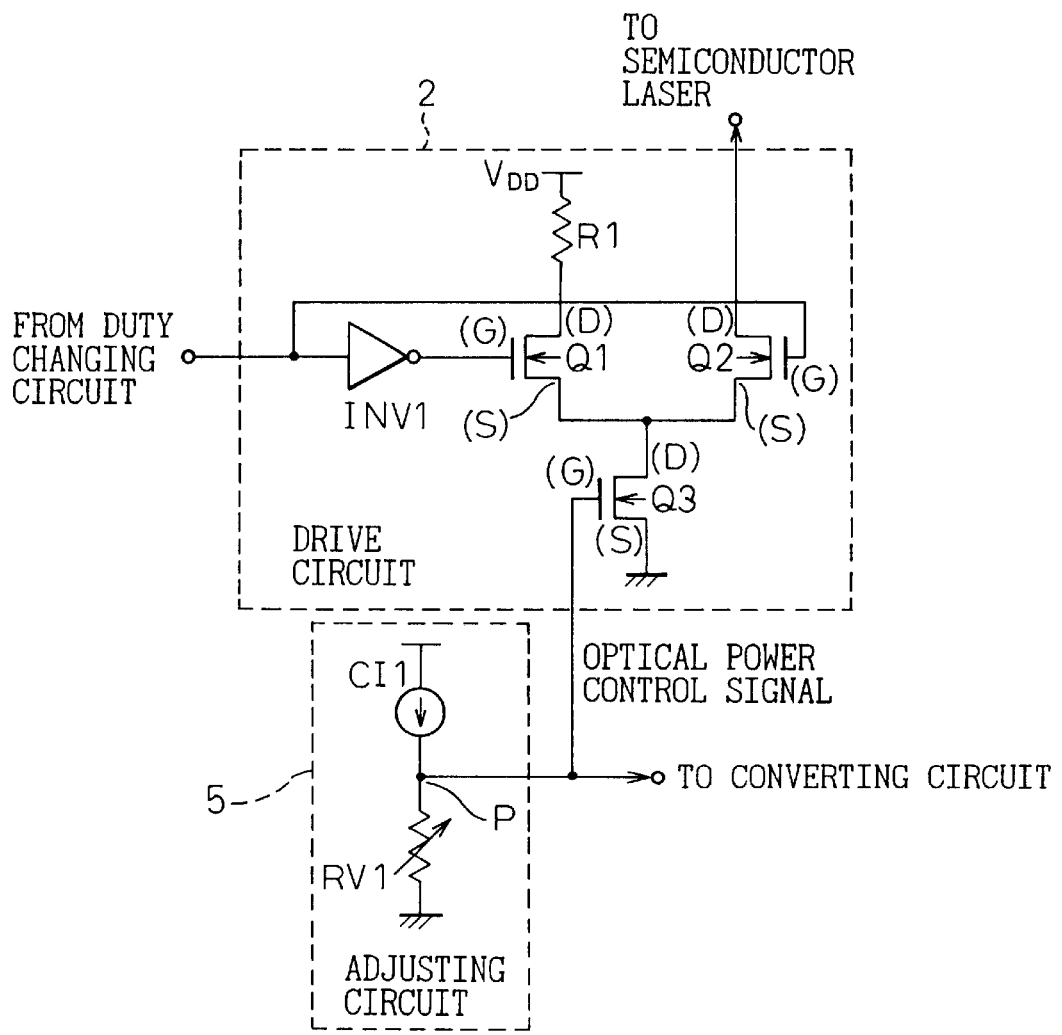
FIG. 4 is a detailed circuit of a drive circuit and an adjusting circuit shown in FIG. 1.

FIG. 4 is a detailed circuit of the drive circuit and the adjusting circuit shown in FIG. 1. In FIG. 4, Q1 to Q3 are N-channel type MOS FETs (below, these are called "transistors"). R1 is a resistor, INV1 is an inverter, RV1 is a variable resistor, and C11 is a constant current source. In the adjusting circuit 5, the constant current source C11 is connected to the variable resistor RV1, and an adjusted voltage (i.e., the optical power control signal) at a common terminal P of the constant current source C11 and the variable resistor RV1 is supplied to a gate of the transistor Q3 of the drive circuit 2. Further, the adjusted voltage is supplied to the converting circuit 4. The initial value is adjusted by the variable resistor RV1 in such a way that the optical power is set to a predetermined value.

The drive circuit 2 includes the transistors Q1 to Q3, the inverter INV1 and the resistor R1. Both source terminals S of the transistors Q1 and Q2 are connected in common to a drain terminal D of the transistor Q3. Further, as mentioned above, the optical power control signal is supplied from the adjusting circuit 5 to the gate G of the transistor Q3. An input signal from the duty changing circuit 3 is directly supplied to a gate G of the transistor Q2, and, at the same time, supplied to a gate G of the transistor Q1 after inversion of the phase by the inverter INV1. That is, the input signal to the gate G of the transistor Q2 and the input signal to gate G of the transistor Q1 have an inverted phase to each other.

A power voltage $V_{DD}$ is supplied to a drain D of the transistor Q1 through the resistor R1. A drain G of the transistor Q2 is connected to the semiconductor laser 1, and the drive current of the semiconductor laser 1 is controlled by the optical power control signal. In this case, when the optical power control signal becomes large, the drive current is increased so that the optical power can be increased.

FIG. 5A is a detailed circuit of the duty changing circuit 3 and the converting circuit 4 shown in FIG. 1. In the drawing, Q4, Q5, Q8, Q9 and Q11 are P-channel type MOS FETS. Q6, Q7 and Q10 are N-channel type MOS FETs. Further, INV2 and INV3 are inverters, R2 to R4 are resistors, A1 is an operational amplifier used as a comparator, A2 is an operational amplifier for amplifying the signal based on a predetermined gain, and C12 is a constant power source. Further, 15 is a current flowing the transistor Q5, and V1 is an input voltage of the inverter INV2.

Further, the converting circuit 4 includes the operational amplifier A2 and resistors R3 and R4. One input terminal of the operational amplifier A2 is connected to the adjusting circuit 5, and the other input terminal is grounded. As is obvious, the converting circuit 4 is constituted by a non-inverted amplifier by the resistors R3 and R4. The optical power control signal which is obtained by adjusting the variable resistor RV1 (see FIG. 4) is supplied to the operation amplifier A2, and converted to the duty control signal having the above-mentioned relationship in the operational amplifier A2. Further, the duty control signal is supplied to one input terminal of the operational amplifier (i.e., a comparator) A1 in the duty changing circuit 3.

The duty changing circuit 3 includes the transistor Q6 for controlling the current flowing in the transistors Q4 and Q5 which constitute a current mirror circuit; the comparator A1 connected to a gate of the transistor Q6; the transistors Q7 and Q8 for receiving the input data DATA at each gate thereof; the transistors Q10 and Q12 in which each gate is connected to a common connection point of the transistors Q5 and Q7; the transistors Q9 and Q11 in which each gate is connected to a common connection point of the transistor Q8 and the constant current source; and the inverters INV2 and INV3 which are cascade-connected to a common connection point of the transistors Q11 and Q12.

For example, when the optical power control signal is supplied to the converting circuit 4 so as to increase the optical power of the semiconductor laser 1 based on the initial setting at the adjusting circuit 5, the duty changing circuit 3 is controlled so as to reduce the duty value based on the relationship shown in FIG. 3. Further, in the duty changing circuit 3, when a level of the duty control signal which is supplied to the comparator A1 is increased, this level of the duty control signal is compared with a voltage across the resistor R2. A resultant level of comparison is supplied to the gate of the transistor Q6 so that the current flowing in the transistor Q6 is increased. As a result, the current 15 flowing in the transistor Q5 is also increased.

When the input data DATA is "1", the transistor Q7 is turned on, and the transistor Q8 is turned off. On the other hand, when the input data DATA is "0", the transistor. Q7 is turned off, and the transistor Q8 is turned on. Further, when the transistor Q7 is turned on, the transistor Q12 is turned off, and the transistor Q11 is turned on so that the voltage V1 becomes high. On the other hand, when the transistor Q7 is turned off, the transistor Q12 is turned on, and the transistor Q11 is turned off so that the voltage V1 becomes low.

Figure 5B:
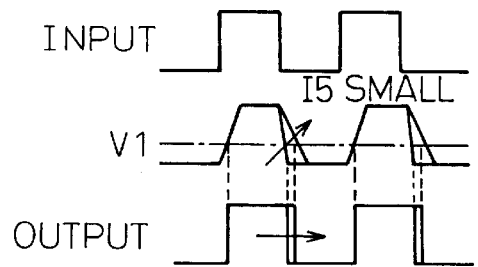
FIG. 5B is a signal timing chart explaining the relationship among an input data DATA, a voltage and an output data of an inverter.

FIG. 5B is a signal timing chart explaining the relationship among the input data INPUT, the voltage V1 and the output data OUTPUT of the inverter INV3. As shown by the waveform of the voltage V1, the pulse waveform of the input data becomes gradual at both leading and trailing edges thereof. In this case, when the current 15 flowing in the transistor Q5 is reduced, the trailing edge of the voltage V1 is changed so as to be gradual as shown by an arrow.

On the other hand, when the current 15 is increased, the trailing edge becomes steep. These changes of the waveform of the voltage V1 are converted to the pulse waveform based on the threshold values in the inverters INV2 and INV3. Accordingly, when the current 15 is reduced, the pulse width of the output signal OUTPUT is changed so as to become narrow as shown by the arrow. On the other hand, when the current 15 is increased, the pulse width is changed so as to become wide.

As mentioned above, based on the initial setting in the adjusting circuit 5, when the optical power control signal for reducing the optical power of the semiconductor laser 1 is supplied to the drive circuit 2, the duty control signal from the converting circuit 4 to the duty changing circuit 3 is converted so as to increase the duty value W based on the relationship shown in FIG. 3. Accordingly, the current 15 flowing in the transistor Q5 is reduced, the trailing edge of the waveform of the voltage V1 becomes gradual so that the pulse width of the output of the inverter INV3 becomes wide. That is, the duty value W is controlled so as to become wide. Accordingly, it is possible to simultaneously perform the initial setting of the optical power and the duty value in accordance with adjustment of the variable resistor RV1 of the adjusting circuit 5.

Figure 6:
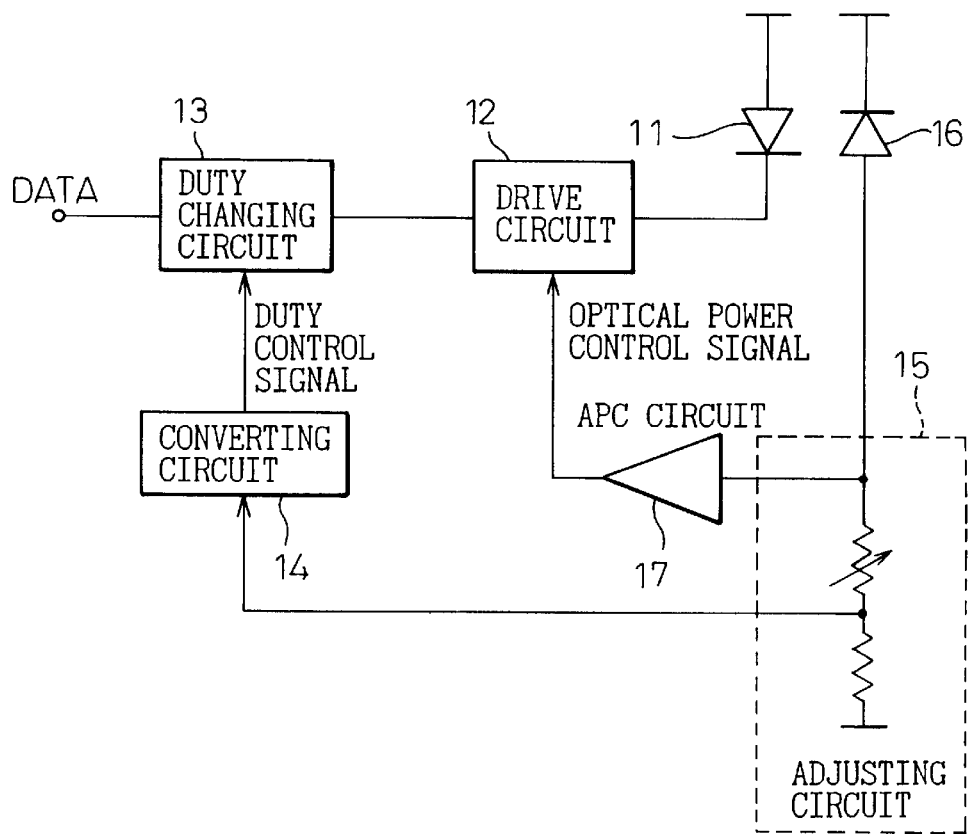
FIG. 6 is a schematic block diagram of the optical transmission circuit according to a second embodiment of the present invention.

FIG. 6 is a schematic block diagram of the optical transmission circuit according to a second embodiment of the present invention. In FIG. 6, reference number 11 denotes the semiconductor laser, 12 is a drive circuit, 13 is a duty changing circuit, 14 is a converting circuit, 15 is an adjusting circuit, 16 is the photodiode, and 17 is the automatic power control (APC) circuit. In this embodiment, the optical power of the semiconductor laser 11 is monitored by the photodiode 16.

When ignoring the threshold current in the semiconductor laser 1, the current Im in the photodiode 16 and the drive current $I_{LD}$ in the semiconductor laser 11 have a proportional relationship each other. Accordingly, the following relationship is obtained.

When $Im \rightarrow$ large, then, $Td \rightarrow$ small (3)

Accordingly, the adjusting circuit 15 adjusts the current Im flowing in the photodiode 16, and, at the same time, controls the voltage by the variable resistor. The adjusted voltage is supplied to the converting circuit 14 so that the duty control signal is supplied from the converting circuit 14 to the duty changing circuit 13. Accordingly, the initial setting of the optical power of the semiconductor laser 11 can be performed through the APC circuit 17 in accordance with the initial setting by the variable resistor in the adjusting circuit 15, and the initial setting of the duty value of the input data from the duty changing circuit to the drive circuit 12 can be achieved.

Figure 7:
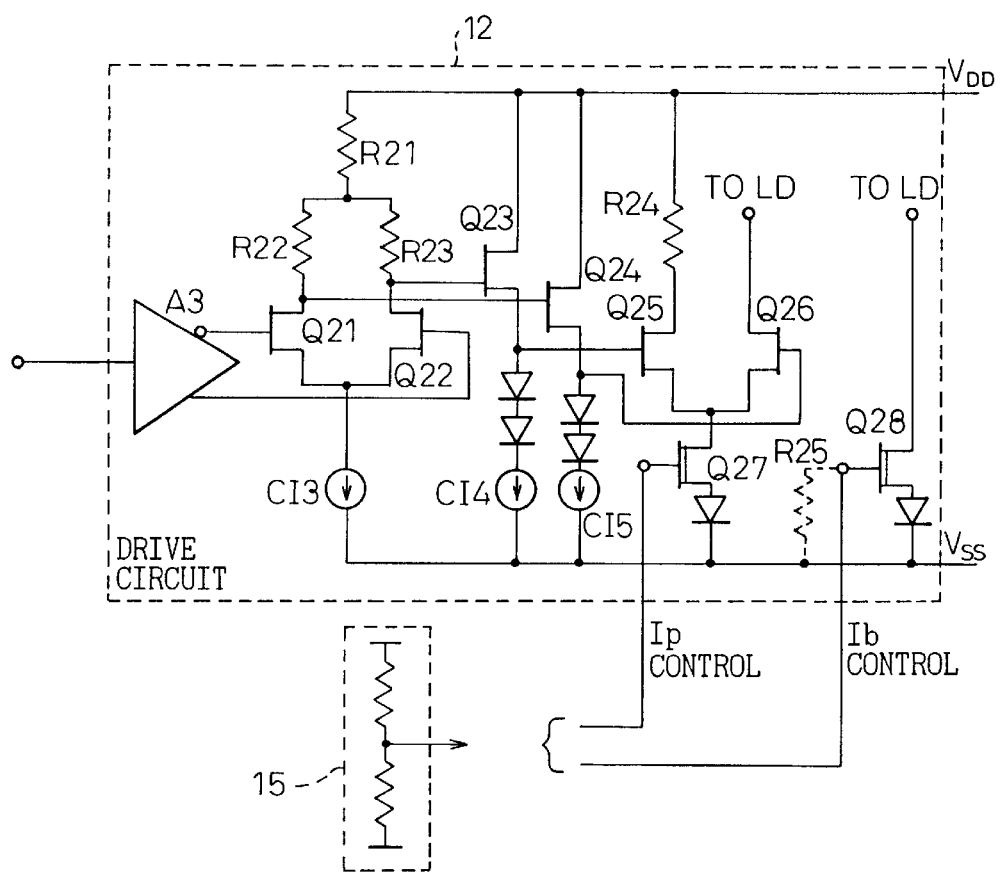
FIG. 7 is a detailed circuit of the drive circuit shown in FIG. 6.

FIG. 7 is a detailed circuit of the drive circuit 12 shown in FIG. 6. In FIG. 7, Q21 to Q28 are MOS FETs, and Q27 and Q28 are depression type FETs (below, these are called "transistors"). Further, A3 is a buffer amplifier having a complementary output, R21 to R25 are resistors, C13 to C15 are constant current sources, and $V_{DD}$ and $V_{SS}$ are power voltages.

Further, LD is the semiconductor laser, and the bias current Ib is supplied to the semiconductor laser LD through the transistor Q28. Further, the modulation current Ip, which corresponds to the input data, is also supplied to the semiconductor laser 1 through the transistor Q26. In this case, the modulation current Ip and the bias current Ib are controlled in accordance with the optical power control signal based on the initial setting by the adjusting circuit 15. In this case, when the bias current Ib is set to zero, the transistor Q28 can be omitted. On the other hand, when the bias current Ib is set to a constant value, the resistor R25 shown by dotted line is connected to the gate of the transistor Q28.

The transistors Q23 and Q24 are provided to convert the level between the transistors Q21 and Q22 and the transistors Q25 and Q26 (a differential pair is formed by the transistors Q21 and Q22, and by the transistors Q25 and Q26), based on the diode D and the constant current sources C14 and C15. For example, when the input data "1" is supplied to the buffer amplifier A3, one transistor Q21 is turned off, and the other transistor Q22 is turned on. As a result, the transistor Q24 is turned on, and the transistor Q26 is also turned on so that the modulation current Ip is supplied to the semiconductor laser LD through the transistors Q27 and Q26.

Since the modulation current Ip can be adjusted by controlling the transistor Q27 so that the optical power of the semiconductor laser LD can be adjusted in accordance with the modulation current Ip (see Ip control in FIG. 7), the optical output of the semiconductor laser LD can be controlled by the optical output control signal from the adjusting circuit 15. In this case, of course, it is possible to apply the drive circuit 12 of FIG. 7 to the drive circuit 2 of FIG. 2.

Figure 8:
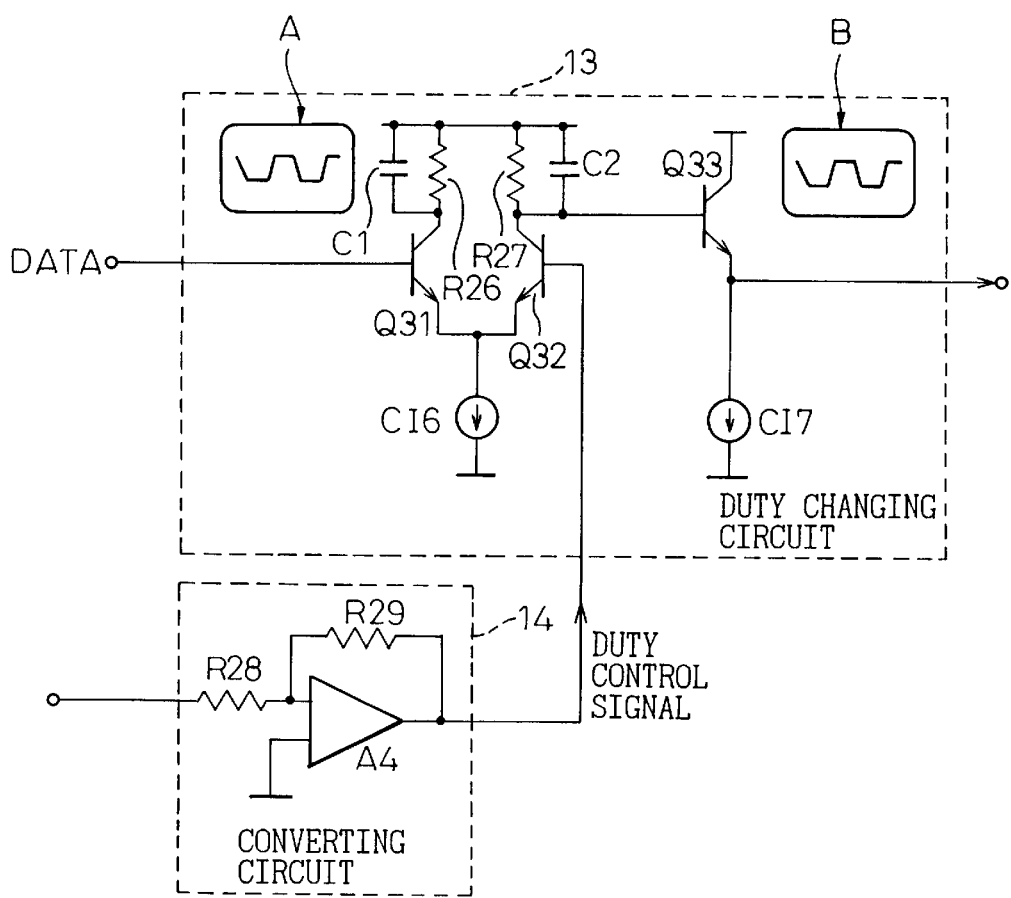
FIG. 8 is a detailed circuit of the duty changing circuit shown in FIG. 6.

FIG. 8 is a detailed circuit of the duty changing circuit shown in FIG. 6. In FIG. 6, Q31 to Q33 are N-channel bipolar transistors, C1 and C2 are condensers, R26 to R29 are resistors, A4 is an operational amplifier, and CI16 and CI7 are constant current sources.

As shown in the drawing, the converting circuit 14 includes an operational amplifier A4 and resistors R28 and R29 which determine a conversion ratio. The converting circuit 14 outputs the duty control signal to the duty changing circuit 13 in order to control the duty of the input data DATA.

In the duty changing circuit 13, the condenser C1 and the resistor R26 are connected to a collector of the transistor Q31, and the condenser C2 and the resistor R27 are connected to a collector of the transistor Q32. The constant current source CI6 is connected a common point of emitters of the transistors Q31 and Q32. The input data DATA is supplied to a base of the transistor Q31, and the duty control signal is supplied from the converting circuit 14 to a base of the transistor Q32. Further, the input data in which the duty value was adjusted is output from an emitter of the transistor Q33 in which a base thereof is connected to a collector of the transistor Q32.

The input data DATA having trapezoidal waveform, i.e., waveform having slope portions in both the leading and trailing edges (see A), is supplied to the base of the transistor Q31. For example, when the level of the duty control signal from the adjusting circuit 15 becomes high, the level of the duty control signal from the converting circuit 14 also becomes high. Accordingly, the transistor Q31 is turned on and turned off in the vicinity of a peak value of the trapezoidal waveform which has the duty value 100% for the input data DATA so that it is possible to set a long turning-on term of the transistor Q32. As a result, the turning-off term of the transistor Q33 becomes long so that the duty value becomes smaller than 100%.

That is, when the optical power control signal is set in such a way that the optical power becomes large, the duty changing circuit 13 is operated in such a way that the duty value of the input data DATA becomes small. Of course, the duty changing circuit 13 and the converting circuit 14 in FIG. 8 can be applied to the duty changing circuit 3 and the converting circuit 4 in FIG. 1.

Figure 9:
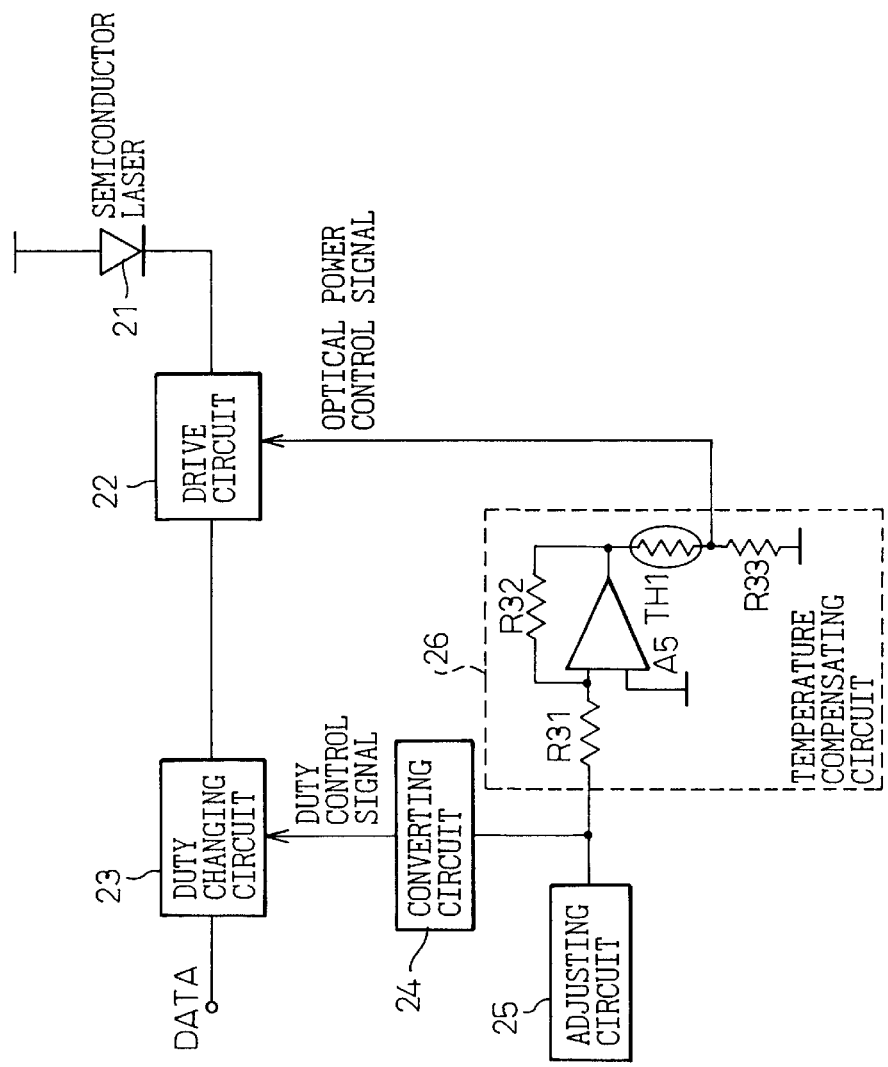
FIG. 9 is a schematic block diagram of the optical transmission circuit according to a third embodiment of the present invention.

FIG. 9 is a schematic block diagram of the optical transmission circuit according to a third embodiment of the present invention. In the drawing, reference number 21 denotes the semiconductor laser, 22 is the drive circuit, 23 is the duty changing circuit, 24 is the converting circuit, 25 is the adjusting circuit, 26 is a temperature compensating circuit, A5 is an operational amplifier, R31 to R33 are resistors, and TH1 is a temperature detecting element, such as a thermistor.

Since the semiconductor laser 21, the drive circuit 22, the duty changing circuit 23, the converting circuit 24, and the adjusting circuit 25 are the same circuits as those of in FIG. 1, detailed explanations will be omitted. Further, in the case of a constant drive current, the semiconductor laser 21 has a characteristic in which, when the temperature rises, a threshold value thereof is increased so that the loss in the laser is increased and the optical power is decreased. Accordingly, the temperature compensating circuit 26 is provided between the drive circuit 22 and the adjusting circuit 25 in order to compensate for the temperature characteristic of the semiconductor laser 21 and the drive circuit 22.

The temperature compensating circuit 26 includes an operational amplifier A5, resistors R31 to R33, and the temperature detecting element TH1 (for example, a thermistor). The peripheral temperature and the temperature of the semiconductor laser 21 are detected by the temperature detecting element TH1. When the temperature rises, the resistance value of the thermistor is reduced. As a result, the level of the optical power control signal from the adjusting circuit 25 is set to a higher value than the initial setting value so that the drive current from the drive circuit 22 to the semiconductor laser 21 is increased so as not to make the optical power decrease. Accordingly, it is possible to realize stable operation in broader range of the change of the temperature.

Figure 10:
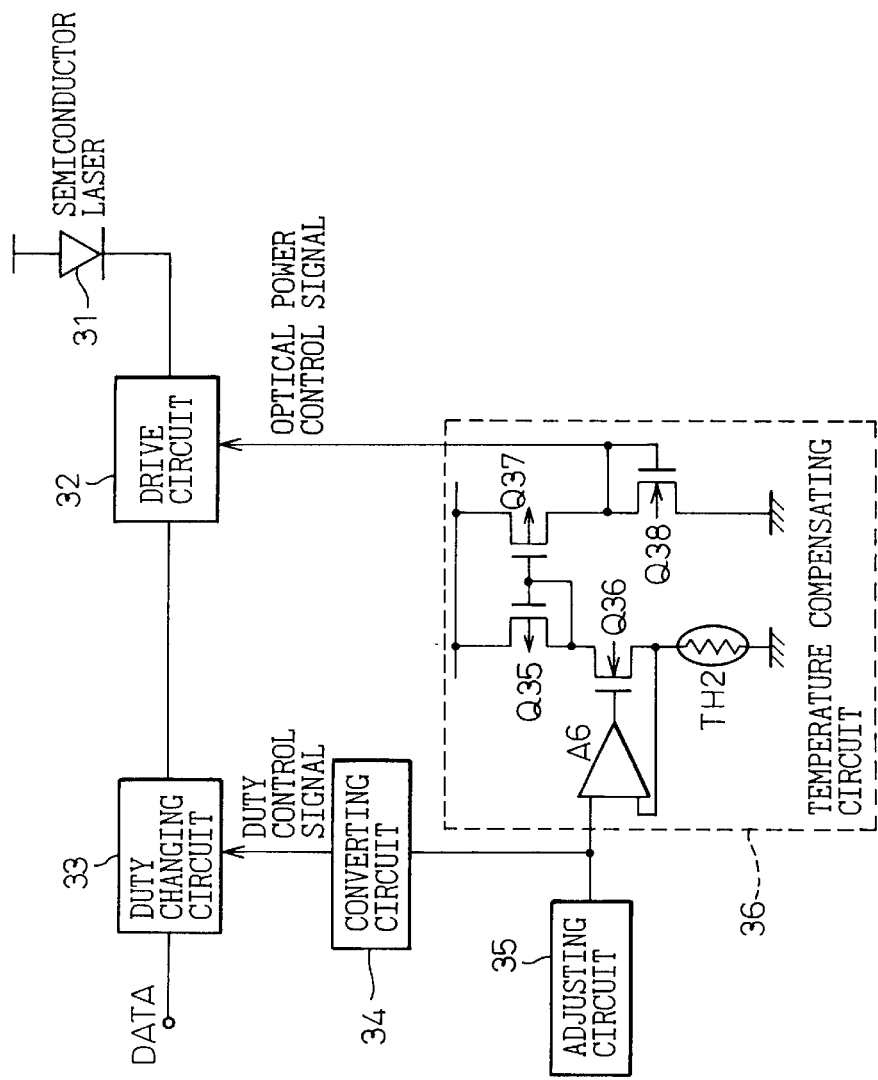
FIG. 10 is a schematic block diagram of the optical transmission circuit according to a fourth embodiment of the present invention.

FIG. 10 is a schematic block diagram of the optical transmission circuit according to a fourth embodiment of the present invention. In FIG. 10, reference number 31 denotes the semiconductor laser, 32 is the drive circuit, 33 is the duty changing circuit, 34 is the converting circuit, 35 is the adjusting circuit, and 36 is a temperature compensating circuit. Further, A6 is a comparator, Q35 to Q37 are P-channel MOS FETs, Q36 to Q38 are N-channel MOS FETs, and TH2 is a temperature detecting element.

The temperature compensating circuit 36 includes the comparator A6, the transistors Q35 to Q38, and the temperature detecting element TH2. The comparator A6 compares the voltage level of the optical power control signal, which is supplied from the adjusting circuit 35 based on the initial setting, with a terminal voltage across the temperature detecting element TH2 so that the transistor Q36 is controlled. As a result, it is possible to control the current flowing in the transistor Q35, which constitutes a current mirror circuit with the transistor Q36, corresponding to the temperature. Accordingly, the optical power control signal supplied from the transistor Q38 to the drive circuit 32 is controlled in accordance with the temperature.

For example, when the optical power of the semiconductor laser 31 is reduced due to increase of the temperature, the optical power control signal based on the initial setting in the adjusting circuit 35 makes the current flowing in the transistors Q35 and Q36 increase, due to reduction of the resistance value of the temperature detecting element TH2. As a result, the optical power control signal having a value higher than the initial setting value is supplied from the transistor Q38 to the drive circuit 32 so that it is possible to compensate for the reduction of the optical power in the semiconductor laser 31.

Figure 11:
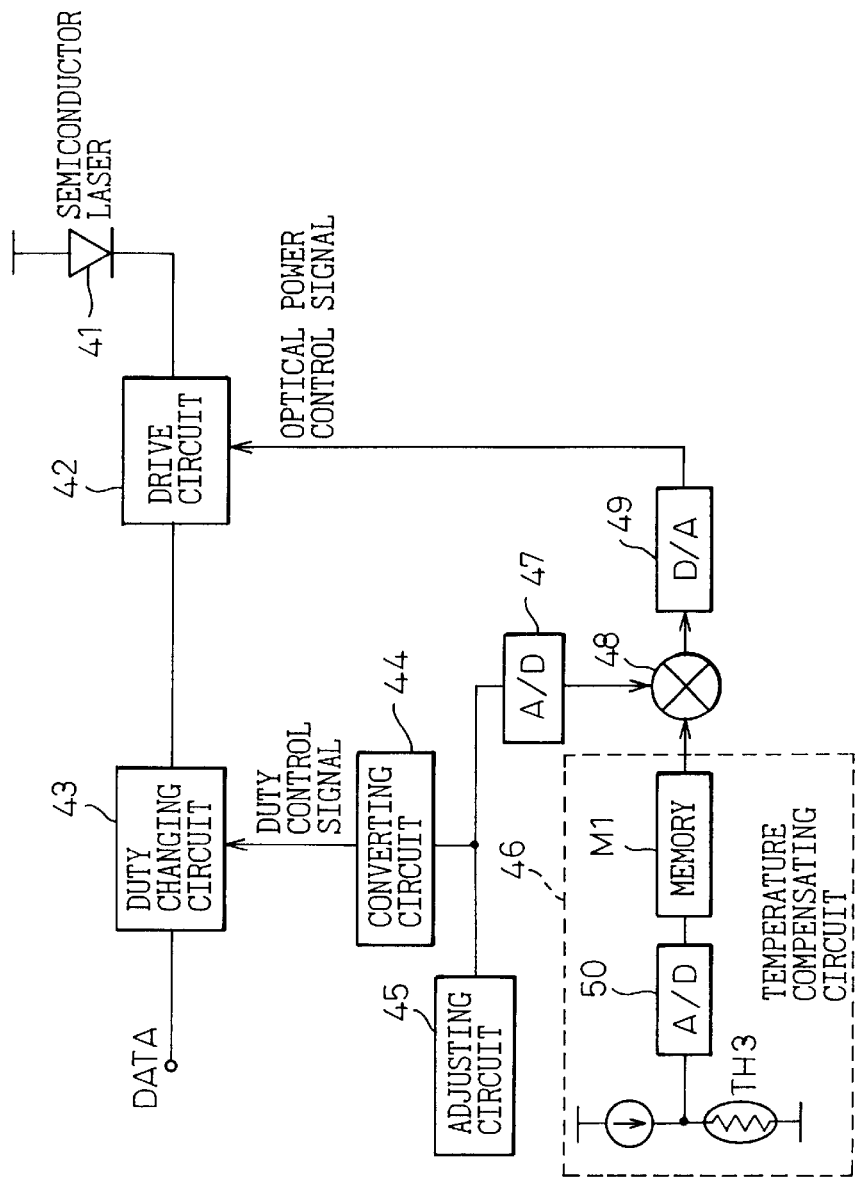
FIG. 11 is a schematic block diagram of the optical transmission circuit according to a fifth embodiment of the present invention.

FIG. 11 is a schematic block diagram of the optical transmission circuit according to a fifth embodiment of the present invention. In FIG. 11, reference number 41 denotes the semiconductor laser, 42 is the drive circuit, 43 is the duty changing circuit, 44 is the converting circuit, 45 is the adjusting circuit, and 46 is the temperature compensating circuit. Further, 47 and 50 are analog-to-digital converters (A/D), 48 is a multiplier, 49 is digital-to-analog converter (D/A), TH3 is the temperature detecting element, and M1 is a memory.

In the temperature compensating circuit 46, the analog signal detected by the temperature detecting element TH3 is converted to the digital signal by the A/D converter 50. The digital signal is supplied to the memory M1 and used as an address signal in the memory M1. The memory M1 stores temperature compensating values each corresponding to a detected temperature. Each temperature compensating value represents a compensating ratio in order to determine an increase or a decrease in the current by considering the initial setting in the adjusting circuit 45.

Further, the temperature compensating value, which is read out from the memory M1, is supplied to the multiplier 48. The adjusting circuit 45 determines the optical power of the semiconductor laser 41, and supplies the optical power control signal to the drive circuit 42 through the A/D converter 47, the multiplier 48 and the D/A converter 49. In this case, the analog signal from the adjusting circuit 45 is converted to the digital signal by the A/D converter 47, and the digital signal is multiplied by the digital temperature compensating value in the multiplier 48. Further, the multiplied signal is converted to the analog signal by the D/A converter 49, and the analog signal is supplied to the drive circuit 42 as the optical power control signal.

For example, when the temperature rises, the resistance value of the temperature detecting element TH3 in the temperature compensating circuit 46 is decreased, and the terminal voltage across the temperature detecting element TH3 is also decreased so that the digital value from the A/D converter 50 becomes small. As mentioned above, the digital value from the A/D converter 50 is used as the address signal for the memory M1, and the temperature compensating value corresponding to the address signal is supplied to the multiplier 48.

In this case, the temperature compensating value represents the ratio which increases the optical power control signal along with the rise of the detected temperature. Accordingly, the level of the optical power control signal converted by the D/A converter 49 becomes large compared to the initial value so that the drive current supplied from the drive circuit 42 to the semiconductor laser 41 is also increased. As a result, it is possible to compensate for the decrease of the optical power of the semiconductor laser 41.

Figure 12:
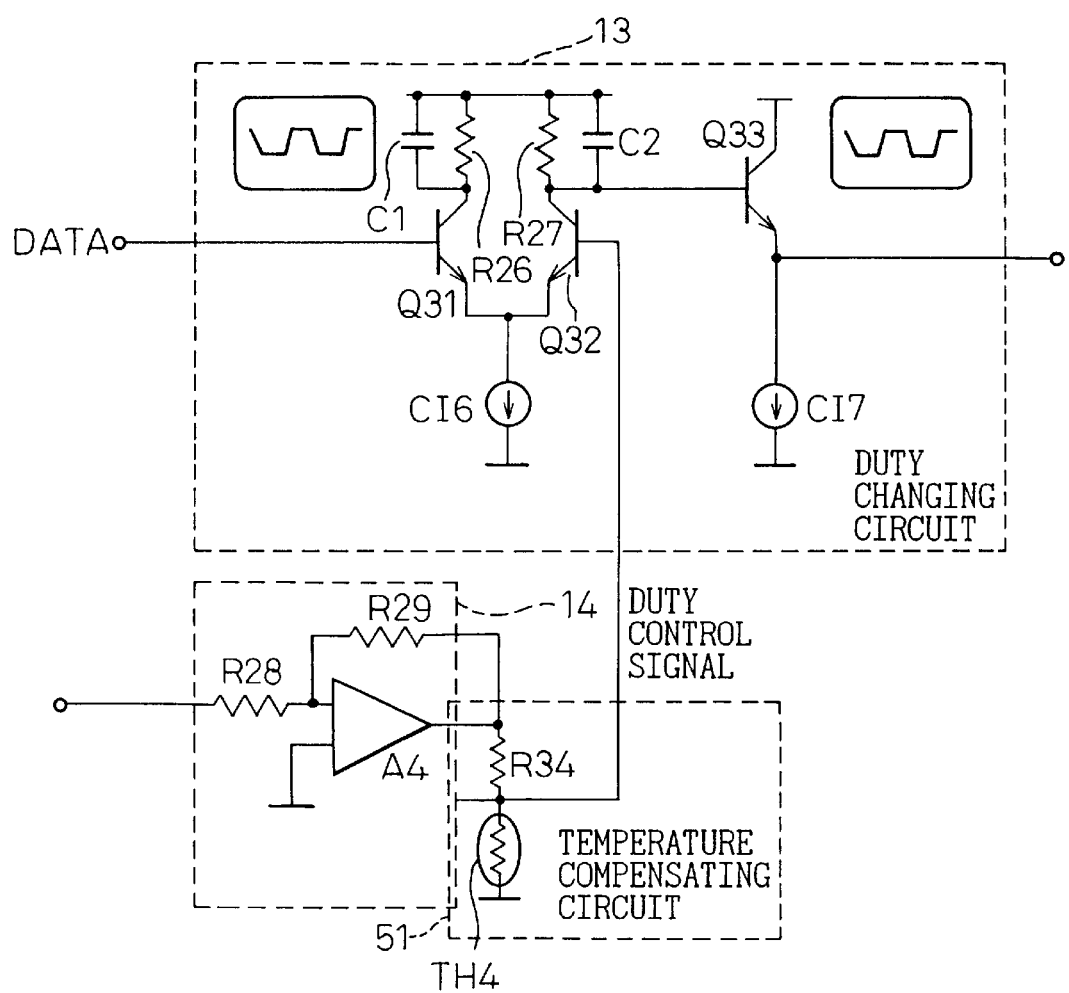
FIG. 12 is a schematic block diagram of the optical transmission circuit according to a sixth embodiment of the present invention.

FIG. 12 is a schematic block diagram of the optical transmission circuit according to a sixth embodiment of the present invention. In FIG. 12, reference number 13 denotes the duty changing circuit, and 14 is the converting circuit. These are the same circuits as shown in FIG. 8. Reference number 51 denotes a temperature compensating circuit which includes a temperature detecting element TH4 and a resistor R34. As shown in the drawing, the temperature compensating circuit 51 is provided between the converting circuit 14 and the duty changing circuit 13, and adjusts the duty value of the input data DATA corresponding to the change of the temperature at the initial setting in the duty changing circuit 13.

The semiconductor laser usually has a characteristic in which, when the temperature rises, a threshold current Ith is increased and the delay Td of oscillation becomes large as shown by the following relationship.

$$\text{When } Ith \rightarrow \text{large, then, } Td \rightarrow \text{large} \ldots \qquad (4)$$

Accordingly, the duty value must be determined to a large value in order to compensate the increase of the delay Td of oscillation when the temperature rises.

For example, when the temperature rises, since the resistance value of the temperature detecting element TH4 is reduced, the initial value of the duty control signal from the converting circuit 14 is also reduced. As a result, since the duty control signal supplied to the base of the transistor Q32 is reduced, it is possible to control the duty changing circuit 13 in such a way that the duty value from the transistor Q32 becomes large so that the delay Td of oscillation is compensated for.

Figure 13:
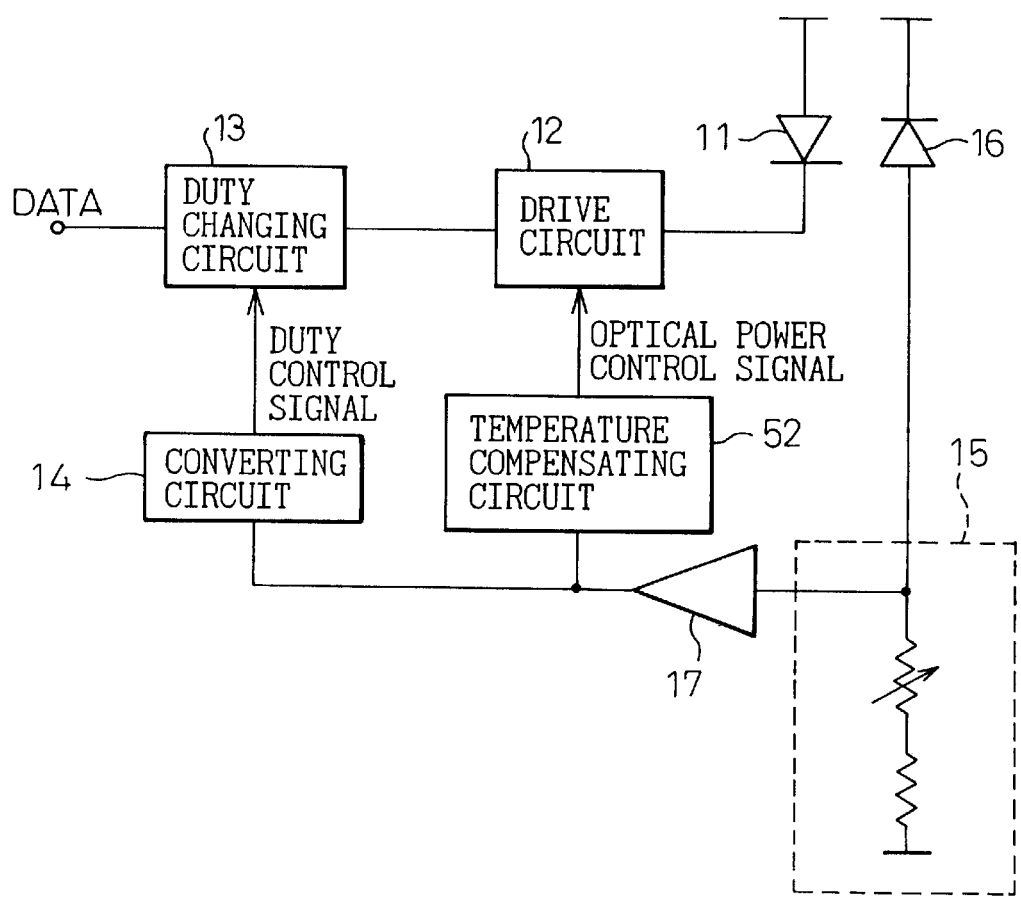
FIG. 13 is a schematic block diagram of the optical transmission circuit according to a seventh embodiment of the present invention.

FIG. 13 is a schematic block diagram of the optical transmission circuit according to a seventh embodiment of the present invention. In FIG. 13, reference number 52 denotes a temperature compensating circuit. As shown in the drawing, the temperature compensating circuit 52 is provided between the APC circuit 17 and the drive circuit 12. When the temperature changes, the optical power control signal is adjusted by the temperature compensating circuit 52 so that it is possible to maintain the initial optical power by using the adjusting circuit 15. In this case, the temperature compensating circuit 52 can be applied to all preceding embodiments according to the present invention.

Figure 14A:
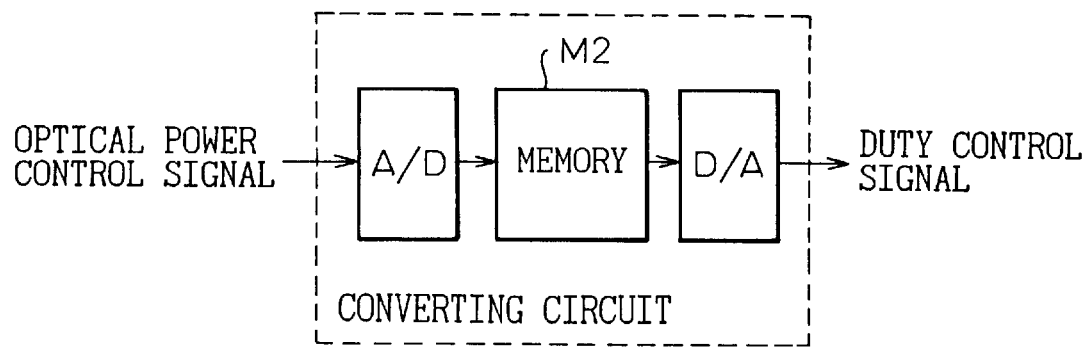
FIGS. 14A and 14B are detailed block diagrams of the converting circuit (FIG. 14A) and the adjusting circuit (FIG. 14B) according to an eighth embodiment of the present invention.
Figure 14B:
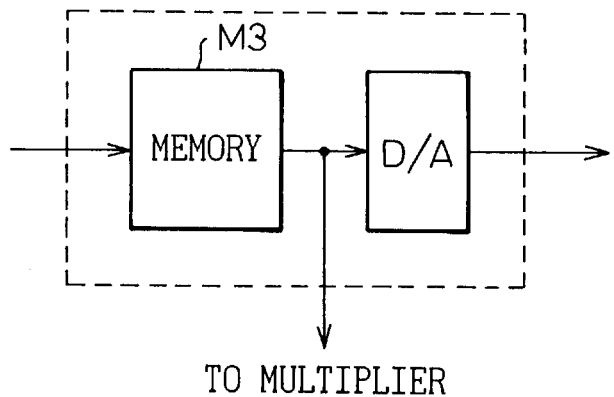

FIGS. 14A and 14B are detailed block diagrams of the converting circuit (FIG. 14A) and the adjusting circuit (FIG. 14B) according to an eighth embodiment of the present invention. The converting circuit in FIG. 14A includes an A/D converter, a memory M2 and a D/A converter. Preferably, a read only memory (ROM), or an electrically-erasable/programmable ROM (EEPROM) can be used as the memory M2 which stores the control signal for controlling the duty value, which corresponds to the optical power control signal supplied to the drive circuit 12.

Accordingly, the optical power control signal through the adjusting circuit or the APC circuit is converted to the digital signal by the A/D converter, and is supplied to the memory M2 as an access signal. Further, the duty control signal is read out from the memory, and converted to the analog signal by the D/A converter. The analog signal is supplied to the duty changing circuit.

Since this converting circuit does not need an operational amplifier and the like, it is possible to realize a miniaturized and stable circuit. As a result, this converting circuit can be used in all preceding embodiments according to the present invention.

The adjusting circuit in FIG. 14B includes a memory M3 and a converter. A read only memory (ROM), or a electrically-erasable/programmable ROM (EEPROM) can be used as the memory M3. The memory M3 stores a plurality of optical power control signal, and each of optical power control signal is selectively read out from the memory M3 as the initial setting value which is provided by a higher apparatus (for example, a processor), or manually determined by an operator. The optical power control signal is converted to the analog signal by the D/A converter, and is supplied to the converting circuit and the drive circuit.

This adjusting circuit can be used in all preceding embodiments according to the present invention. When this adjusting circuit is applied to the circuit shown in FIG. 11, it is possible to omit the A/D converter 47, and to directly supply the digital optical power control signal from the memory M3 to the multiplier 48.

Figure 15:
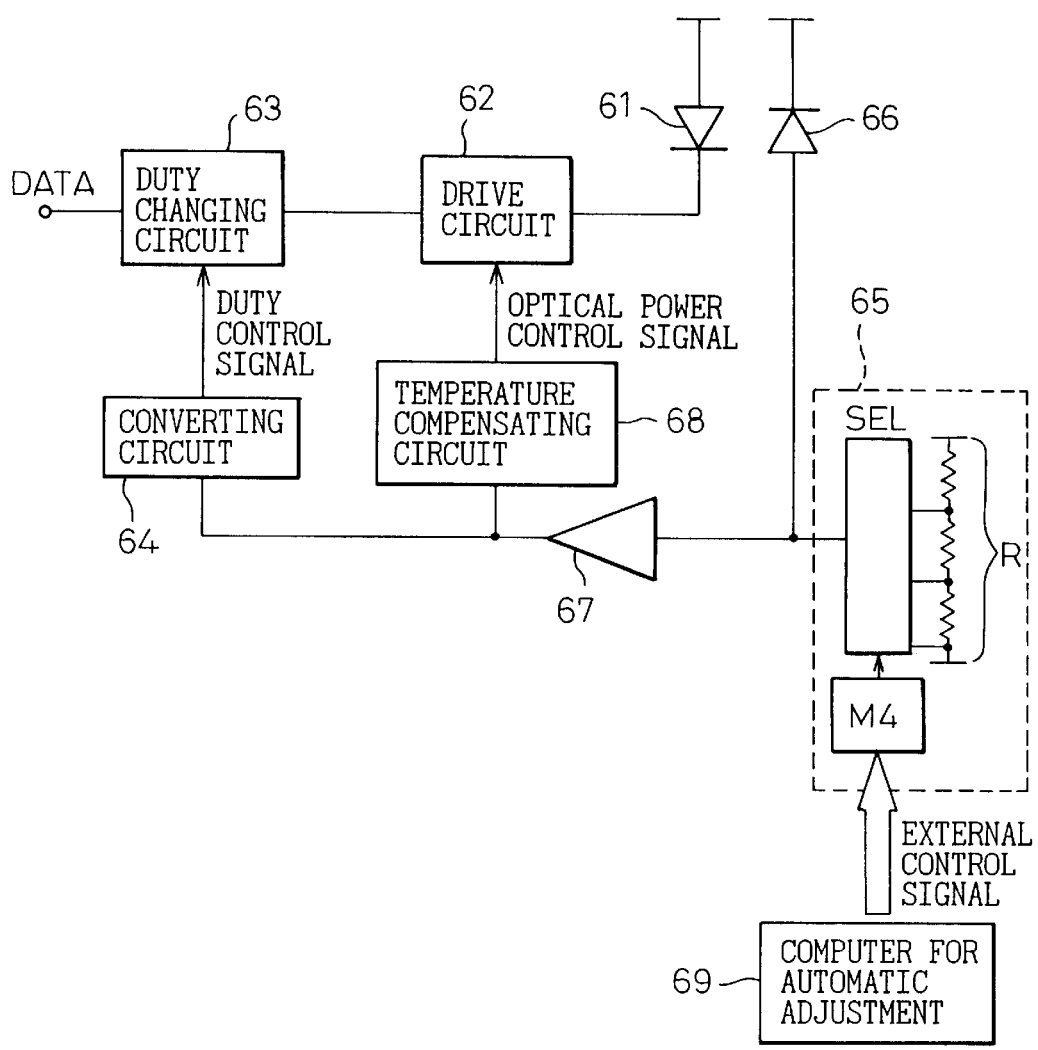
FIG. 15 is a schematic block diagram of the optical transmission circuit according to a ninth embodiment of the present invention.

FIG. 15 is a schematic block diagram of the optical transmission circuit according to a ninth embodiment of the present invention. In FIG. 15, reference number 61 denotes the semiconductor laser, 62 is the drive circuit, 63 is the duty changing circuit, 64 is the converting circuit, 65 is the adjusting circuit, 66 is the photodiode, 67 is the APC circuit, and 68 is the temperature compensating circuit. Further, 69 is a computer for automatic adjustment, M1 is a memory, and SEL is a selector.

In this embodiment, the adjusting circuit 65 includes the selector SEL and the memory M4 for controlling the selector SEL. The selector SEL selectively outputs one resistance value from a resistance type potential divider R in order to determine the current flowing in the photodiode 66. The computer 69 outputs an external control signal to the memory M4 in order to control the resistance value. When the circuit is operated as the optical transmission circuit, the selector SEL is controlled by the data from the memory M4, and the selected initial setting value is supplied from the selector 65 to the APC circuit 67.

In this embodiment, it is possible to automatically perform the initial setting by measuring the optical power and the duty of the semiconductor laser 61 using a predetermined measuring apparatus (not shown), inputting the measure value to the computer 49, and writing the control data of the selector SEL from the computer 69 to the memory M4 so as to obtain the predetermined optical power and the duty value.

This adjusting circuit 65 can be used in all preceding embodiments according to the present invention, and it is possible to simplify various procedures for adjusting a plurality of optical transmission circuits so as to have a predetermined optical power, and to realize the initial setting with very high precision.

Figure 16:
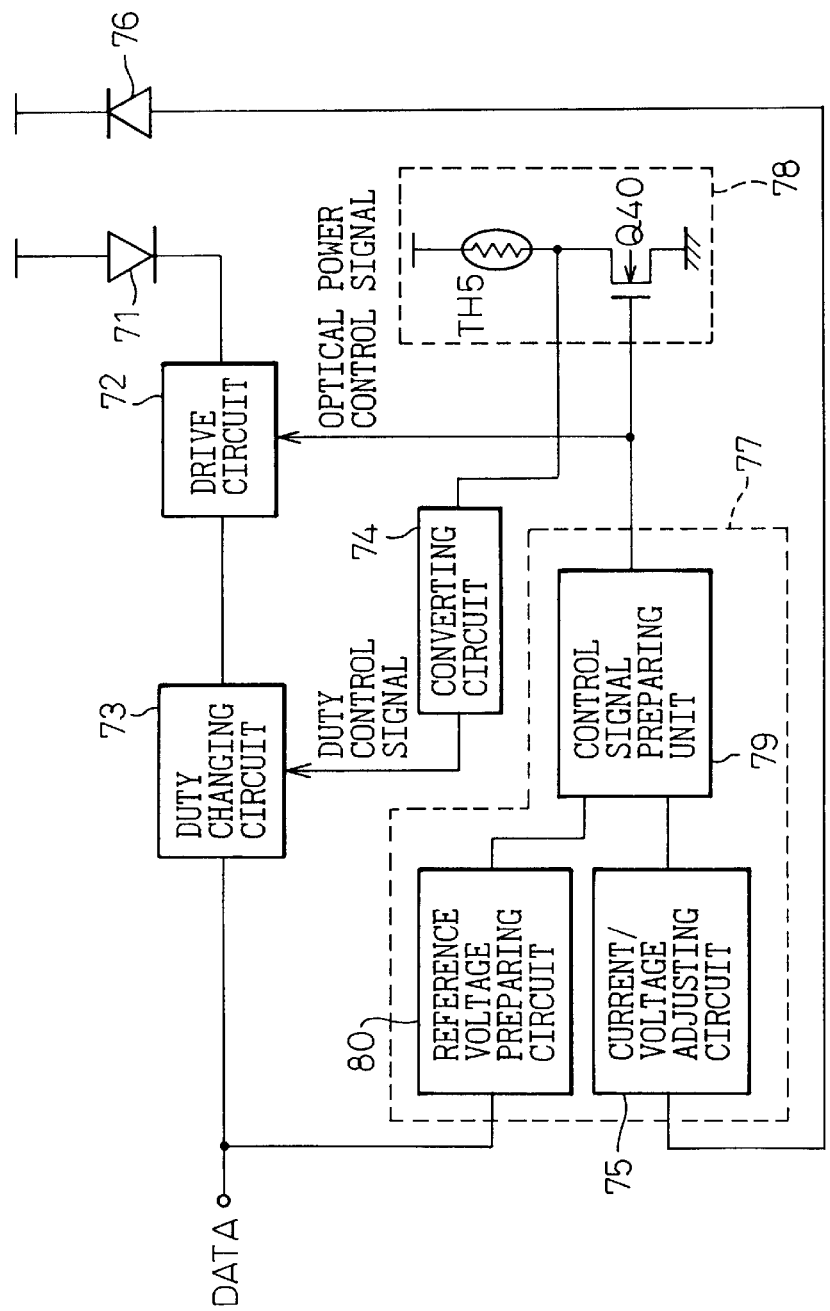
FIG. 16 is a schematic block diagram of an optical transmission circuit according to a tenth embodiment of the present invention.

FIG. 16 is a schematic block diagram of the optical transmission circuit according to a tenth embodiment of the present invention. In FIG. 16, reference number 71 denotes the semiconductor laser, 72 is the drive circuit, 73 is the duty changing circuit, 74 is the converting circuit, 75 is a current/voltage adjusting circuit, 76 is the photodiode, 77 is the APC circuit, 78 is the temperature compensating circuit, 79 is a control signal preparing unit, and 80 is a reference voltage preparing circuit.

In this embodiment, the optical transmission circuit including the APC circuit shown in FIGS. 6, 13 and 15. The temperature compensating circuit 78 includes a temperature detecting element TH5, for example, a thermistor, and an N-channel MOS FET (Q40). The temperature compensating circuit 78 is connected between the APC circuit 77 and the converting circuit 74, and performs temperature compensation of the duty control signal which is supplied to the duty changing circuit 73 through the converting circuit 74.

The APC circuit 77 includes the current/voltage adjusting circuit 75, the control signal preparing unit 79 and the reference voltage preparing circuit 80. For example, the current/voltage adjusting circuit 75 is constituted by the adjusting circuit 15 including the variable resistors for the initial setting as shown in FIG. 13. The reference voltage preparing circuit 80 detects the data for transmitting the optical power based on the input data DATA, and outputs the reference voltage to the control signal preparing unit 79.

Accordingly, the optical power of the semiconductor laser 71 when the data DATA is input, is detected by the photodiode 76, the control signal preparing unit 79 compares the optical detecting signal based on the initial setting by the current/voltage adjusting circuit 75 with the reference voltage from the reference voltage preparing circuit 80, and updates the optical power control signal which is supplied to the drive circuit 72 in order to suppress fluctuation of the optical output of the semiconductor laser 71.

The temperature compensating circuit 78 includes a temperature detecting element TH5 and the transistor Q40, and the optical power control signal is supplied to the gate of the transistor Q40 of which drain terminal is connected to the converting circuit 74. In this case, when the temperature detecting element TH5 is provided by the thermistor, the resistance value becomes small when the temperature rises so that the level of the optical power control signal, which is supplied to the converting circuit 74, is increased.

In this case, when the optical power control signal having the high level is converted to the duty control signal by the converting circuit 74 as it is, the level of the duty control signal also becomes high. The duty changing circuit shown in FIGS. 5, 8 and 12 is controlled so as to obtain a small duty value. That is, in this case, the temperature compensating operation acts to reverse the direction. Accordingly, when the level of the optical power control signal through the temperature compensating circuit 78 is increased, the converting circuit 74 and the duty changing circuit 73 perform conversion or change of duty value so as to obtain a large duty value of the input data DATA.

Figure 17:
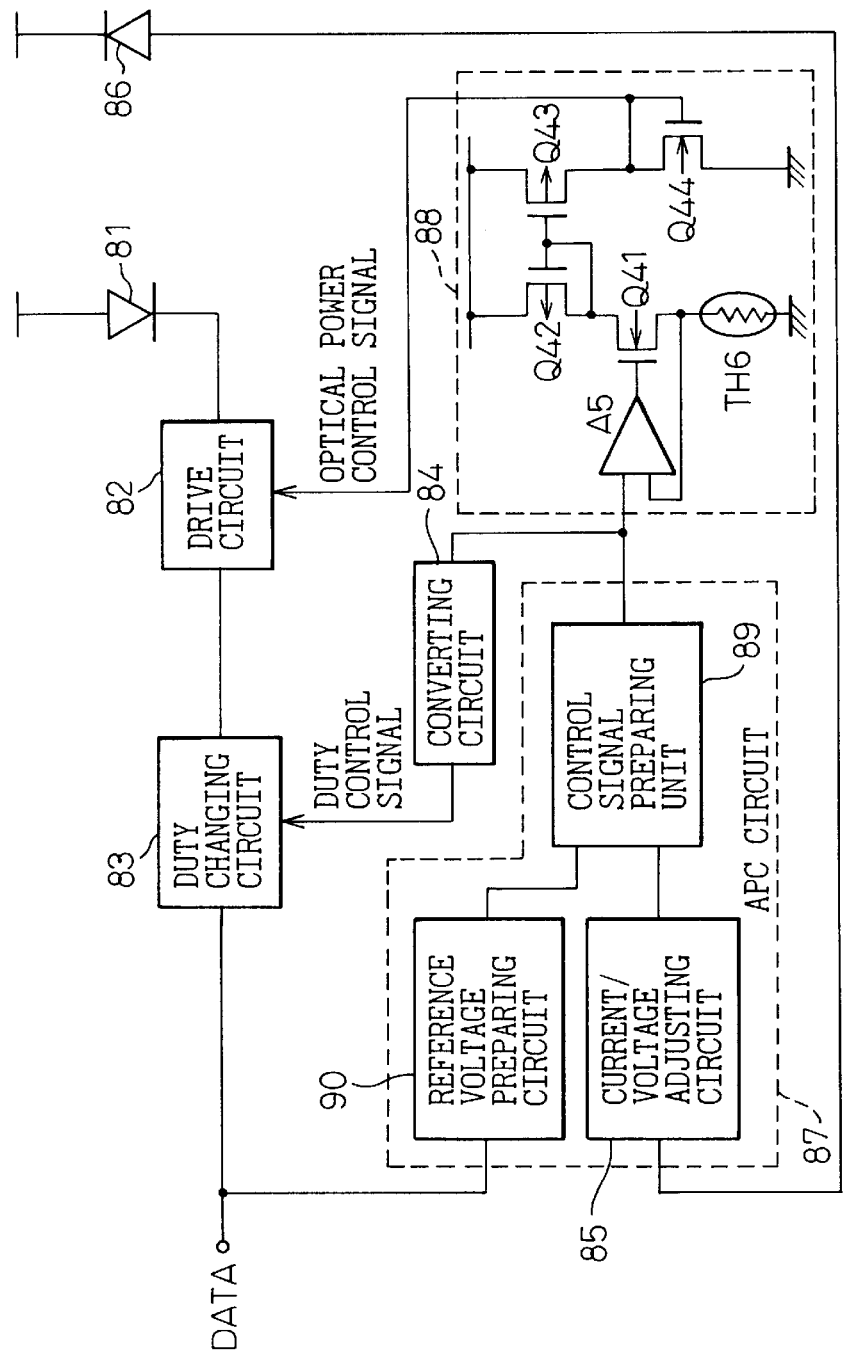
FIG. 17 is a schematic block diagram of the optical transmission circuit according to an eleventh embodiment of the present invention.

FIG. 17 is a schematic block diagram of the optical transmission circuit according to an eleventh embodiment of the present invention. In the drawing, reference number 81 denotes the semiconductor laser, 82 is the drive circuit, 83 is the duty changing circuit, 84 is the converting circuit, 85 is the current/voltage adjusting circuit, 86 is the photodiode, 87 is the APC circuit, 88 is the temperature compensating circuit, 89 is the control signal preparing unit, and 90 is the reference voltage preparing circuit.

In this embodiment, the APC circuit 87 and the converting circuit 84 are connected each other at an input terminal of the comparator A5, and the temperature compensating circuit 88 is provided between the APC circuit 87 and the drive circuit 82. The temperature compensating circuit 88 includes the comparator A5, the temperature detecting element TH6, N-channel MOS FETs (Q41, Q44), and P-channel MOS FETs (Q42, Q43). When the converting circuit 74 is the same circuit as that shown in the preceding embodiments, this circuit corresponds to the structure which performs reverse temperature compensation.

Accordingly, it is possible to obtain a normal temperature compensating characteristic corresponding to the structures of the temperature compensating circuit and the converting circuit 74. In any cases, it is possible to simultaneously adjust the optical power and the duty based on the initial setting in the adjusting circuit.

Figure 18:
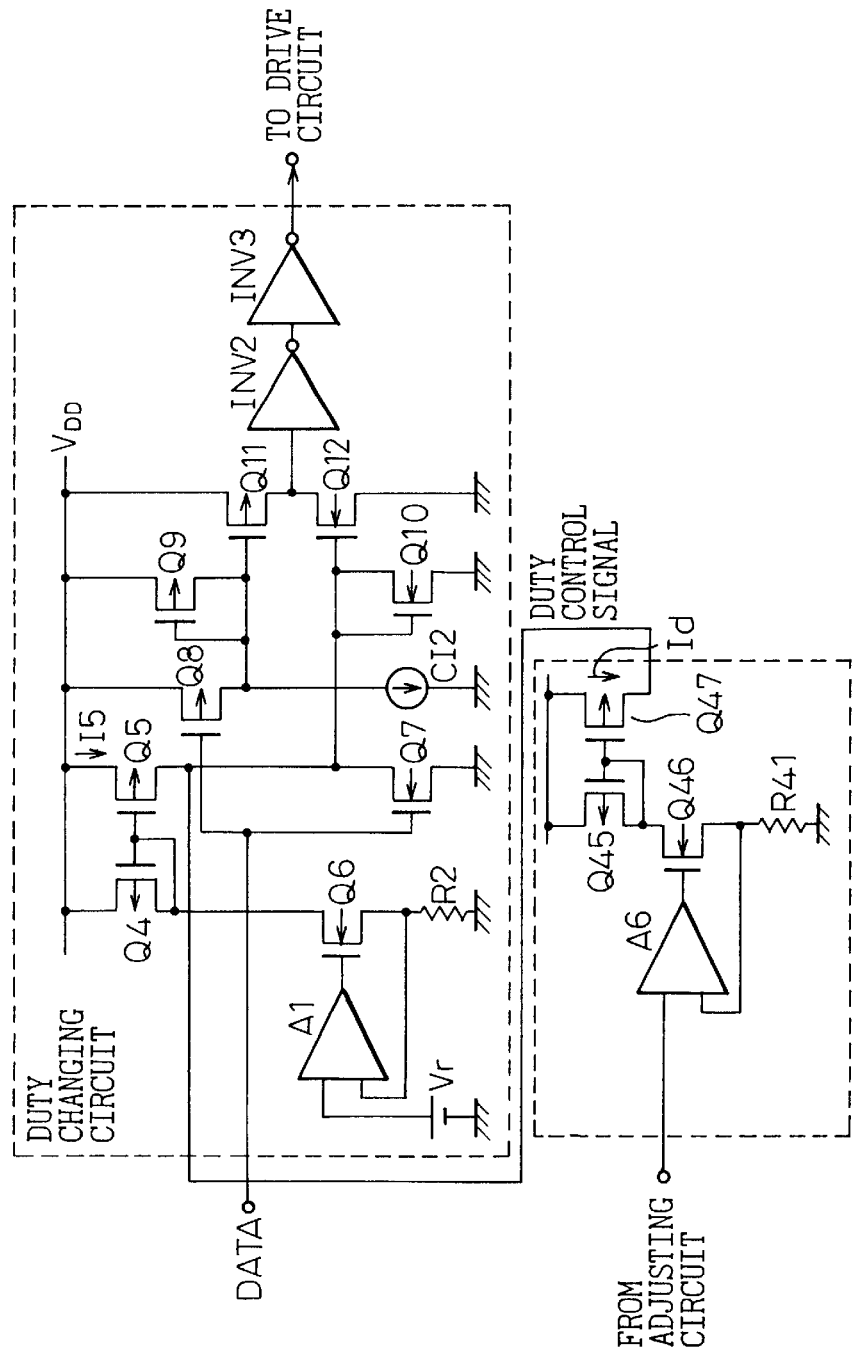
FIG. 18 is a detailed block diagram of the duty changing circuit and converting circuit according to a twelfth embodiment of the present invention.

FIG. 18 is a detailed block diagram of the duty changing circuit and the converting circuit according to a twelfth embodiment of the present invention. The duty changing circuit has the same structure as that of FIG. 5. In the duty changing circuit, the comparator A1 compares a reference voltage Vr with a voltage across the resistor R2 in order to obtain a constant current flowing in the transistor Q6.

The converting circuit includes a comparator A6, P-channel MOS FETs (Q45 and Q47), N-channel MOS FET (Q46) and a resistor R41. A drain of the transistor Q47 is connected to a common connection point of the transistors Q5 and Q7.

Accordingly, the optical power is supplied from the adjusting circuit to the comparator A6, and compared with the voltage across the resistor 41 in order to control the transistor Q46. In this case, when the level of the optical power control signal is increased, the duty control signal based on the current Id from the transistor Q47 is increased. The current Id is supplied to the common connection point of the transistors Q5 and Q7, and acts on the transistor Q6 so as to pass a large current. As a result, the duty value of the input data DATA is controlled so as to become small, and is supplied from the inverter INV3 to the drive circuit. That is, the control signal is supplied from the converting circuit to the duty changing circuit as the current Id.

Figure 19:
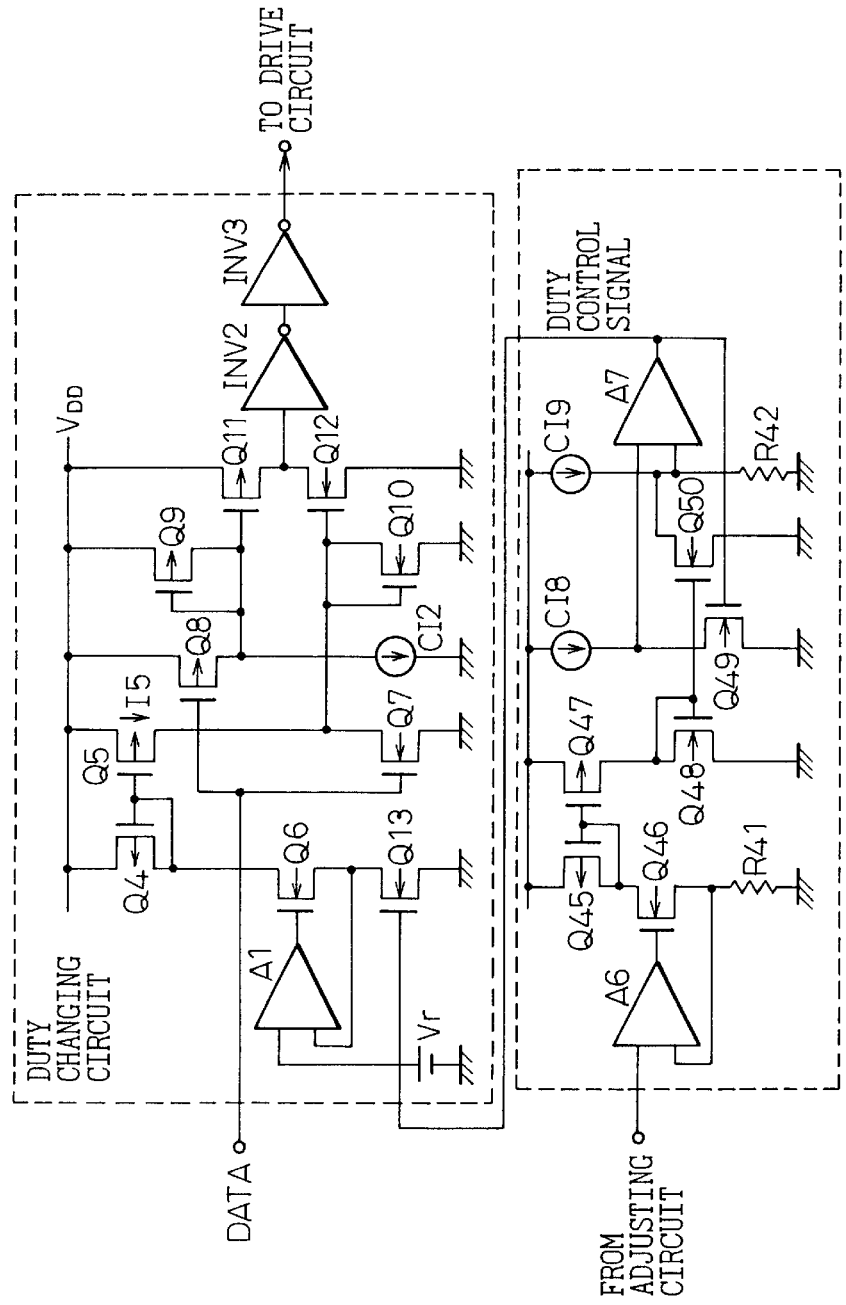
FIG. 19 is a detailed block diagram of the duty changing circuit and the converting circuit according to a thirteenth embodiment of the present invention.

FIG. 19 is a detailed block diagram of the duty changing circuit and the converting circuit according to a thirteenth embodiment of the present invention. The duty changing circuit has the same structure as that of FIGS. 3 and 18. In the duty changing circuit, Q13 and Q48 to Q49 are N-channel MOS FETs, A7 is a comparator, R42 is a resistor, and CI8 and CI9 are constant current sources.

In the duty changing circuit, the transistor Q13 is connected instead of the resistor R2 shown in FIGS. 5 and 18 and it is controlled by the duty control signal from the converting circuit. The converting circuit includes the comparators A6 and A7, the transistors Q45 to Q50, the resistors R41 and R42, and the constant current sources CI8 and CI9.

That is, the current mirror circuit is formed by the transistors Q45 and Q47. Further, the drain of the transistor Q46 is connected to the source of the transistor Q45, the resistor R41 is connected to the source of the transistor Q46 and the comparator A6 compares the voltage across the resistor R41 with the duty control signal from the adjusting circuit. Further, the output of the comparator A6 is connected to the gate of the transistor Q46.

Further, the gate and drain of the transistor Q48 are connected to the source of the transistor Q47 and the gate of the transistor Q50. The constant current source CI8 is connected to the drain of the transistor Q49, and the gate of the transistor Q49 is connected to the output of the comparator A7. Further, the drain of the transistor Q50 is connected to the common connecting point of the constant current source CI9 and the resistor R42. The comparator A7 compares a drain potential of the transistor Q49 with that of the transistor Q50, and the resultant output is supplied to the gate of the transistor Q13 in the duty changing circuit as the converted duty control signal.

Accordingly, the duty control signal from the adjusting circuit is compared with the voltage across the resistor R41, and the current flows in the transistor Q46 corresponding to the level of the duty control signal so that the current flows in the transistors Q47 and Q50. The voltage across the resistor R42 is reduced when the level of the duty control signal is increased. Accordingly, the level of the duty control signal from the comparator A7 becomes high. That is, when the level of the optical power control signal is increased so that the optical power becomes large, the duty value of the input data DATA is controlled by the duty changing circuit so as to become small.

Figure 20:
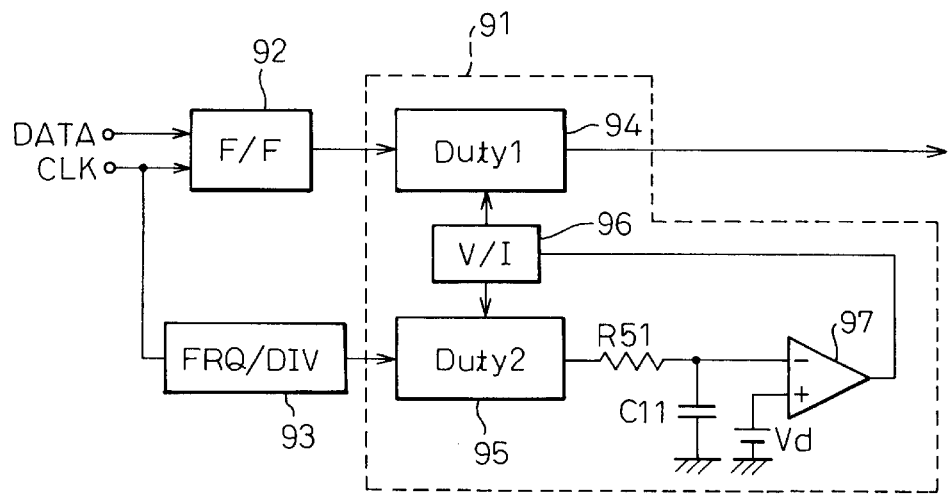
FIG. 20 is a detailed block diagram of a duty changing circuit having a clock reference type in the thirteenth embodiment of the present invention.

FIG. 20 is a detailed block diagram of the duty changing circuit having the clock reference type in the thirteenth embodiment of the present invention. In FIG. 20, reference number 91 is a clock reference type duty control circuit, 92 is a flip-flop circuit (F/F), and 93 is a frequency divider (FRE/DIV). The duty control circuit 91 includes first and second duty changing units 94 and 95 (Duty 1 and Duty 2), a voltage/current converter (V/I) 96, a comparator 97, a condenser C11, and a resistor R51. Further, Vd is a reference voltage.

The clock signal CLK has a predetermined clock rate in accordance with a rate of the input data DATA. The input data DATA is synchronized with the clock signal CLK in the flip-flop circuit 92, and an output signal from the flip-flop circuit 92 is supplied to the first duty changing unit 94. Further, the clock signal CLK is supplied to the frequency divider 93, and divided into two frequencies. The divided clock signal is supplied to the second duty changing unit 95 as a signal having the duty value 100%.

The first and second duty changing units 94 and 95 have the same structure each other, and each duty changing unit 94 and 95 controls the duty value based on a signal from the voltage/current converter 96. Further, the second duty changing unit 95 outputs a signal, in which the duty value was adjusted, to one input terminal of the comparator 97. In this case, a mean value obtained by a mean circuit, which is constituted by the resistor R51 and the condenser C11, is supplied to the one input terminal of the comparator 97. The mean value is compared with the reference voltage Vd. In this case, the reference voltage Vd is used as the duty control signal which can be obtained at the initial setting or detection of the optical power in the optical transmission circuit.

Figure 21:
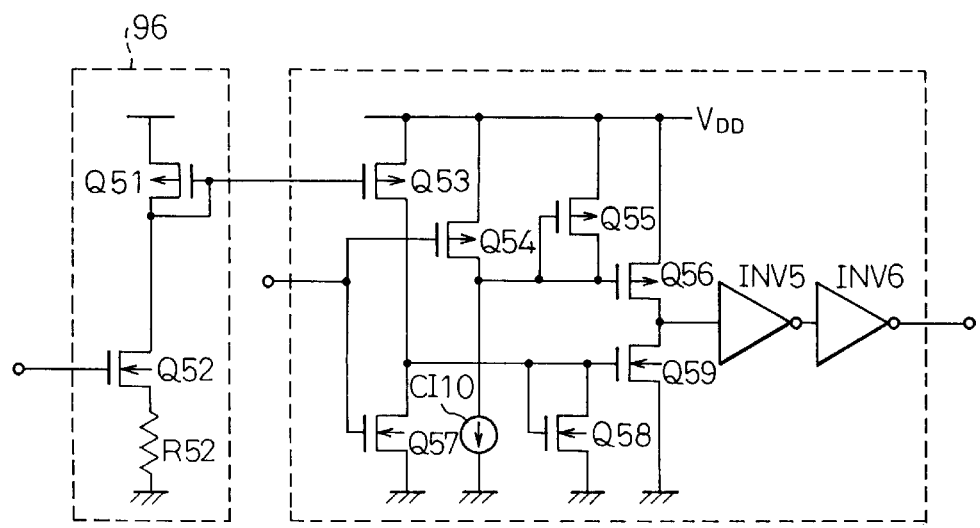
FIG. 21 is a detailed block diagram of the duty changing circuit and voltage/current converter in the thirteenth embodiment of the present invention.

FIG. 21 is a detailed block diagram of the duty changing circuit and a voltage/current converter in the thirteenth embodiment of the present invention. In FIG. 21, Q51 and Q53 to Q56 are P-channel type MOS FETS. on the other hand, Q52 and Q57 to Q59 are N-channel MOS FETS. Further, R52 is a resistor, INV 5 and INV 6 are inverters, and CI10 is a constant current source.

The voltage/current converter 96 includes a transistor Q52 in which an output signal from the comparator (see FIG. 20) is supplied to a gate thereof, a transistor Q51 of which source and gate are connected to the drain of the transistor Q52, and a resistor R52 connected to the source of the transistor Q52. Further, a current mirror circuit is constituted by the transistor Q53 in the duty changing unit and the transistor Q51 in the voltage/current converter 96. Accordingly, the voltage/current converter 96 corresponds to the structure which is structured by the transistors Q4 and Q6, and the resistor R2 in FIG. 18.

The output signal from the flip-flop circuit 92 or the frequency divider 93 (see FIG. 20) is supplied to gates of the transistors Q54 and Q57. Accordingly, when the current which flows in the transistor Q52 is increased, the current which flows in the transistor Q53 is also increased so that the duty of the data output from the inverter INV6 becomes small. On the contrary, when the current which flows in the transistor Q53 is decreased, the current which flows in the transistor Q53 is also decreased so that the duty of the data output from the inverter INV6 becomes large.

Figure 22:
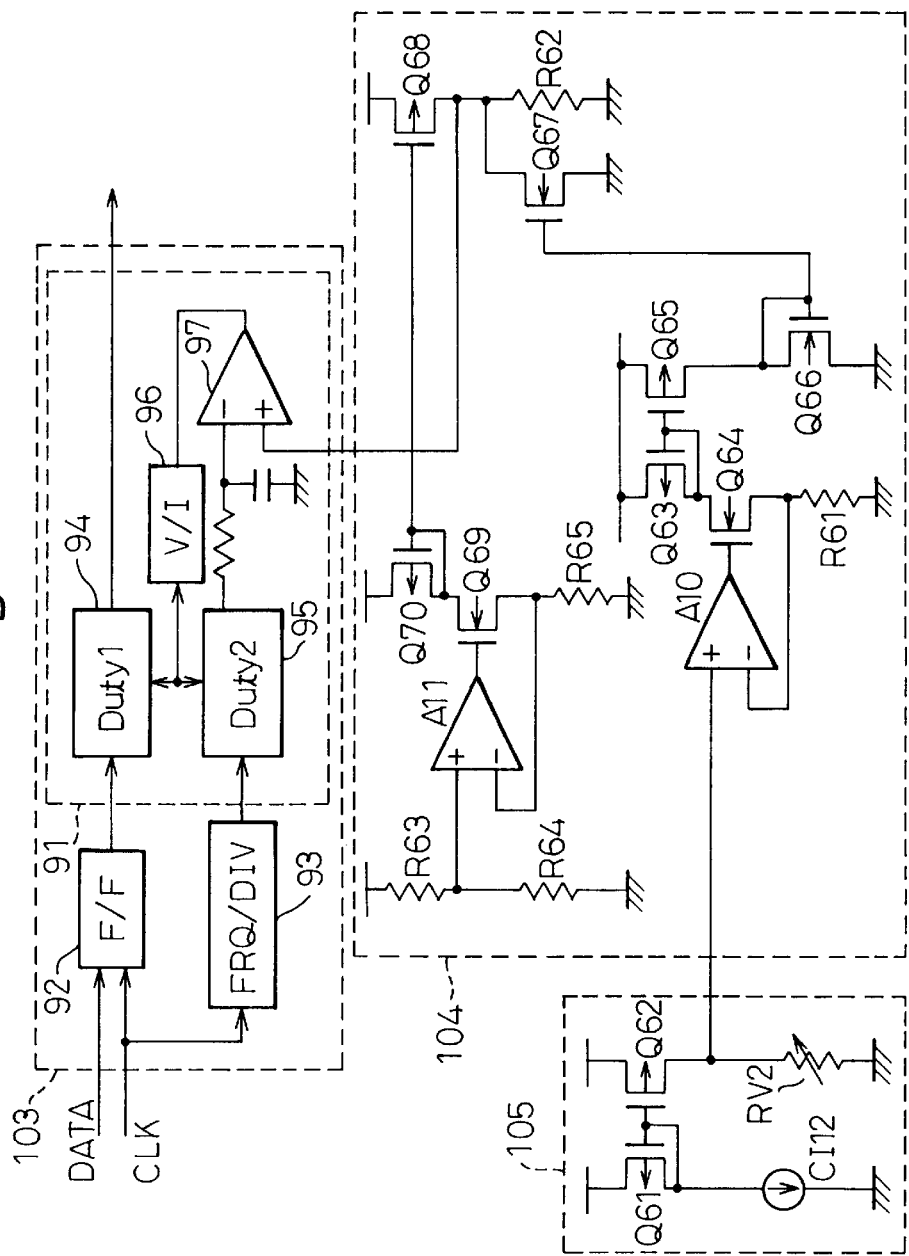
FIG. 22 is a schematic block diagram of the optical transmission circuit according to a fourteenth embodiment according to the present invention, which includes the clock reference type duty changing circuit, the converting circuit and the adjusting circuit.

FIG. 22 is a schematic block diagram of the optical transmission circuit according to a fourteenth embodiment according to the present invention, which includes the clock reference type duty changing circuit 103, the converting circuit 104 and the adjusting circuit 105. The input data DATA is supplied the flip-flop circuit (F/F) 92, and the clock signal CLK is supplied to the flip-flop circuit 92 and the frequency divider 93 as well as the structure of FIG. 20.

The converting circuit 104 includes comparators A10 and A11; resistors R61 to R65; N-channel MOS FETs Q64, Q66, Q67 and Q69; and P-channel MOS FETs Q63, Q65, Q68 and Q70. The adjusting circuit 105 includes P-channel MOS FETs Q61 and Q62, a constant current source CI12 and a variable resistor RV2.

The circuit including the comparator A11, the transistors Q69 and Q70, and the resistors R63 to R65, is an initial value preparing unit. Further, the circuit including the transistors Q67 and Q68 and the resistor R62 is a linkage adjusting unit. The circuit including the comparator A10, the transistors Q63 to Q66 and resistor R61 is a current amount adjusting unit. The gate of the transistor Q70 in the initial value preparing unit is connected to the gate of the transistor Q68 in the linkage adjusting unit so that the current which is set by the initial value preparing unit flows in the transistor Q68.

When a signal level which is input to a plus (+) terminal in the comparator A10 is adjusted so as to become high by adjusting the variable resistor RV2 in the adjusting circuit 105, i.e., when the signal level of the optical power control signal becomes high and the optical power of the semiconductor laser is increased, the current flowing in the transistor Q64 is increased so that the current flowing in the transistors Q66 and Q67 is also increased. Accordingly, the voltage across the resistor R62, i.e., the voltage input to the plus terminal of the comparator 97 in the duty changing circuit 103 is decreased. In this case, the voltage at the plus terminal of the comparator. 97 corresponds to the reference voltage Vd of FIG. 20.

Accordingly, the input data DATA is controlled by the clock reference type duty changing circuit 103 for the direction in which the duty value becomes small. That is, for example, when adjusting the optical power of the semiconductor laser so as to increase, the duty value is adjusted so as to decrease in accordance with increase of the optical power of the semiconductor laser. Accordingly, it is possible to adjust the duty value in relation to the optical power by using only one adjusting point.

Figure 23:
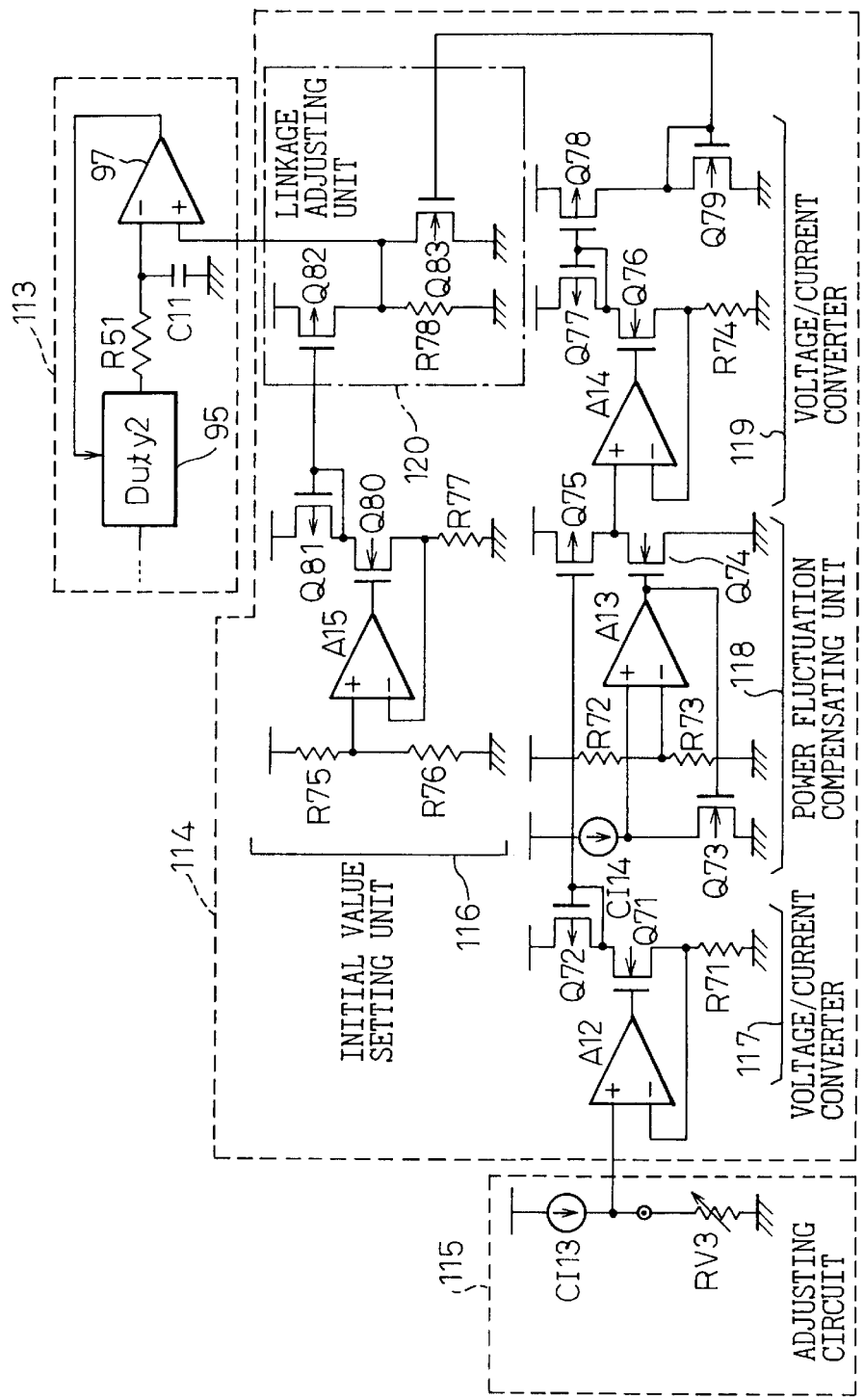
FIG. 23 is a schematic block diagram of the optical transmission circuit according to a fifteenth embodiment according to the present invention, which includes the clock reference type duty changing circuit, the converting circuit and the adjusting circuit.

FIG. 23 is a schematic block diagram of the optical transmission circuit according to a fifteenth embodiment according to the present invention, which includes the clock reference type duty changing circuit 113, the converting circuit 114 and the adjusting circuit 115. As shown in the drawing, only the second duty changing unit (Duty 2), the resistor R51, the condenser C11 and the comparator 97 are shown in the clock reference type duty changing circuit 113, and other structural elements are omitted.

The adjusting circuit 115 includes the constant current source CI13 and the variable resistor RV3. The converting circuit 114 includes the voltage/current converter 117 having the comparator A12, the resistor R71 and the transistors Q71 and Q72; the power fluctuation compensating unit 118 having the comparator A13, the resistors R72 and R73, the constant current source CI14 and the transistors Q73 to Q75; the voltage/current converter 119 having the comparator A14, the transistors Q76 to Q79 and the resistor R74; the initial value setting unit 116 having the comparator A15, the resistors R75 to R77 and the transistors Q80 and Q81; and the linkage adjusting unit 120 having the transistors Q82 and Q83 and the resistor R78. In this case, the transistors include N-channel MOS FETs and P-channel MOS FETs.

When the optical power control signal which increases the optical power is supplied from the adjusting circuit 115 to the comparator A12 by adjusting the variable resistor RV3, the current which flows in the transistor Q71 is increased through the comparator A12. That is, the current which flows in the transistor Q75 of the power fluctuation compensating unit 118 is increased in accordance with the voltage which is supplied to the comparator A12 through the transistor Q71.

In the power fluctuation compensating unit 118, the power voltage is divided by the resistors R72 and R73, and the divided voltage is supplied to the minus (–) terminal of the comparator A13. In this case, when the power voltage is reduced, the current which flows in the transistor Q74 is increased. On the contrary, when the power voltage is increased, the current which flows in the transistor Q74 is reduced. As a result, it is possible to compensate for the signal level change due to fluctuation of the power voltage at each unit.

The signal which corresponds to the optical power control signal from the adjusting circuit 114 and which compensates the fluctuation of the power voltage, is supplied to the plus terminal of the comparator A14 in the voltage/current converter 119. The transistor Q79 and the transistor Q83 are connected each other so as to form the current mirror circuit, the signal from the power fluctuation compensating unit 118 is supplied to the linkage adjusting unit 120 as the current value, and the voltage across the resistor R78 is supplied to the plus terminal of the comparator 97 in the duty changing circuit 113.

At that time, when the level of the optical power control signal is increased, the level which is supplied to the plus terminal of the comparator 97 is reduced so that the duty value is controlled so as to become small. That is, when the optical power is adjusted so as to increase, the duty value is controlled so as to become small. Contrary, when the optical power is adjusted so as to decrease, the duty value is controlled so as to become large. As a result, it is possible to transmit the optical signal in which the delay of oscillation of the semiconductor laser is compensated for. Further, it is possible to control the optical power and the duty value due to fluctuation of the power voltage with high speed.

Figure 24:
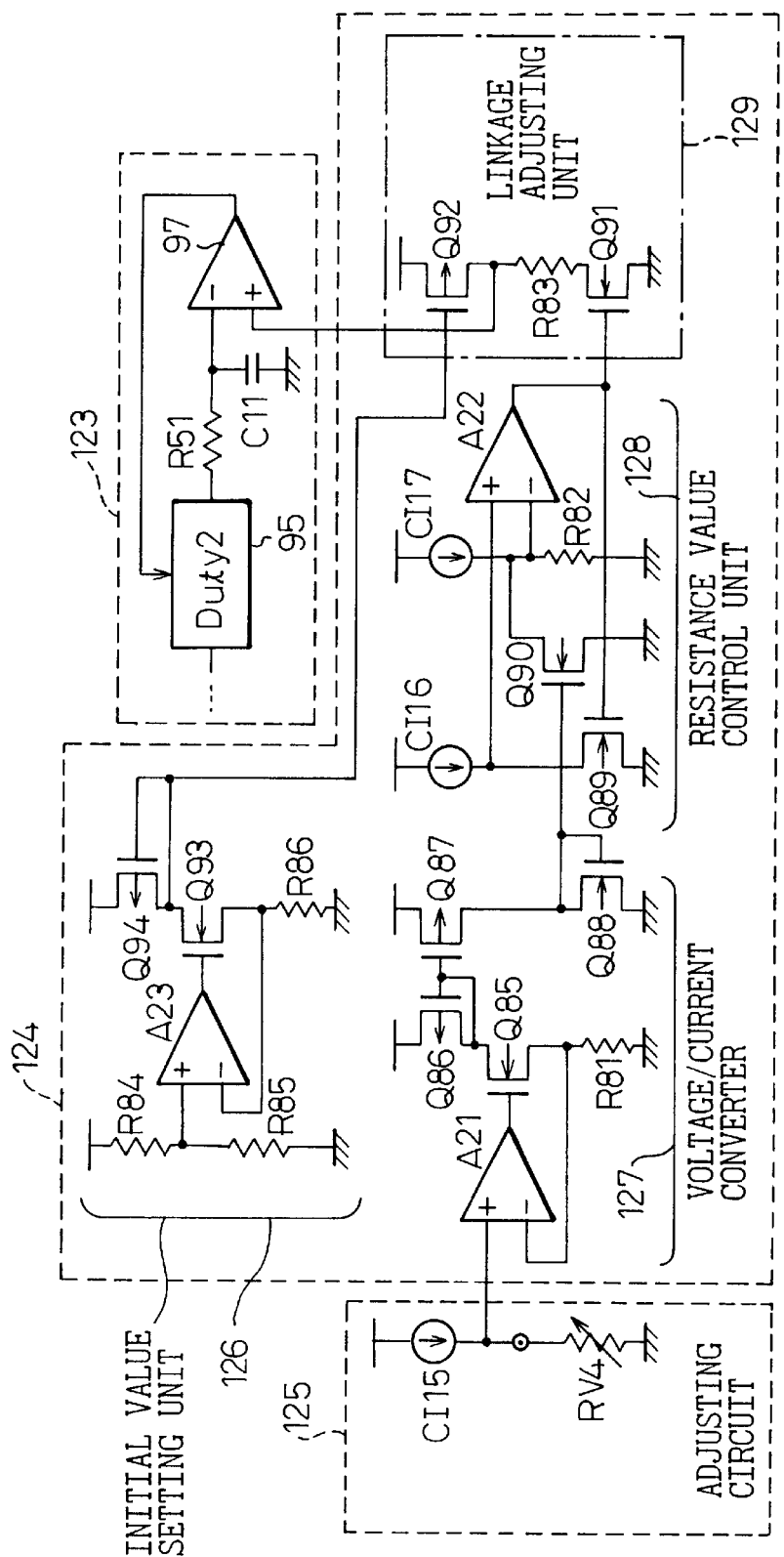
FIG. 24 is a schematic block diagram of the optical transmission circuit according to a sixteenth embodiment according to the present invention, which includes the clock reference type duty changing circuit, the converting circuit and the adjusting circuit.

FIG. 24 is a schematic block diagram of the optical transmission circuit according to a sixteenth embodiment according to the present invention, which includes the clock reference type duty changing circuit 123, the converting circuit 124 and the adjusting circuit 125. As shown in the drawing, only the second duty changing unit (Duty 2), the resistor R51 and the comparator 97 are shown in the clock reference type duty changing circuit 123, and other structural elements are omitted.

A21 to A23 are comparators; CI15 to CI17 are constant current sources; RV4 is the variable resistor; R81 to R86 are resistors; Q85, Q88, Q89, Q90, Q91 and Q93 are N-channel MOS FETS; and Q86, Q87, Q92 and Q94 are P-channel MOS FETs.

The adjusting circuit 125 includes the constant current source CI15 and the variable resistor RV4. The converting circuit 124 includes the initial value setting unit 126, the voltage/current converter 127, the resistance value control unit 128 and the linkage adjusting unit 129. The initial value setting unit 126 has the same structure as the initial value setting unit 116 in FIG. 23, and determines the initial value by the resistors R75 to R77. Further, the setting value is supplied to the base of the transistor Q92 in the linkage adjusting unit 129.

The voltage/current converter 127 has the same structure as the voltage/current converter 117 in FIG. 23. The resistance value control unit 128 controls the transistor Q91 in the linkage adjusting unit 129 in response to the voltage supplied by the voltage/current converter 127. In this case, an equivalent resistance value of the transistor Q91 which is connected in series to the resistor R83 is controlled by the resistance value control unit 128.

For example, when the adjusting circuit 125 outputs the optical power control signal so as to increase the optical power of the semiconductor laser in accordance with adjustment of the variable resistor RV4, the current which flows in the transistor Q85 in the voltage/current converter 127 is increased so that the source potential of the transistor Q88 becomes high. As a result, the current which flows in the transistor Q90 in the resistance value control unit 128 is increased, and the level of the output signal of the comparator A22 becomes high.

Accordingly, the equivalent resistance value of the transistor Q91 in the linkage adjusting unit 129 becomes small, and the signal level supplied to the plus terminal of the comparator 97 in the duty changing circuit 123 is reduced so that the duty value is controlled so as to become small. That is, when the adjusting circuit 125 is controlled so as to increase the optical power, the duty is controlled so as to becomes small.

As explained above in detail, according to the present invention, since it is possible to perform the initial setting of the optical power of the semiconductor laser 1 and the initial setting of the duty value of the optical pulse in one adjusting circuit 5, it is possible to realize easy initial setting of the circuit. Further, since only one adjusting circuit 5 is provided, it is possible to realize a miniaturized circuit and low cost. Furthermore, by adding the temperature compensating circuit, it is possible to compensate for the temperature characteristic of the semiconductor laser 1 and to maintain the constant optical power from the semiconductor laser 1.

What is claimed is:

1. An optical transmission circuit comprising:
   a semiconductor laser;
   a drive circuit connected to the semiconductor laser for supplying drive current to the semiconductor laser in accordance with a drive circuit control signal provided to the drive circuit;
   a duty changing circuit connected to the drive circuit for receiving an input data and changing a duty value of the input data in accordance with a duty control signal provided to the duty changing circuit, the drive current being supplied by the drive circuit in accordance with the changed duty value; and
   a converting circuit for converting an input control signal which is provided as the drive circuit control signal to the drive circuit and which increases the drive current, to an output control signal which is provided to the duty changing circuit as the duty control signal and which decreases the duty value of the input data.

2. An optical transmission circuit as claimed in claim 1, further comprising:
   an adjusting circuit supplying an optical power control signal provided to the drive circuit as the drive circuit control signal and provided to the converting circuit as the input control signal, wherein the converting circuit comprises an analog-to-digital (A/D) converter which converts the optical power control signal to a digital signal used as an address signal; a memory accessed by the address signal from the A/D converter and for storing the duty control signal in correspondence with the address signal; and a digital-to-analog (D/A) converter which converts a digital duty control signal read out from the memory to an analog duty control signal in order to supply the analog duty control signal to the duty changing circuit.

3. An optical transmission circuit as claimed in claim 1, further comprising:
   an adjusting circuit supplying an optical power control signal provided to the drive circuit as the drive circuit control signal and provided to the converting circuit as the input control signal; and
   a temperature compensating circuit which is provided between the adjusting circuit and the drive circuit in order to compensate for a temperature characteristic of the semiconductor laser.

4. An optical transmission circuit as claimed in claim 1, further comprising a temperature compensating circuit which is provided between the converting circuit and the duty changing circuit in order to compensate for both the temperature characteristics of the semiconductor laser and the duty changing circuit.

5. An optical transmission circuit as claimed in claim 4, further comprising:
   an adjusting circuit supplying an optical power control signal provided to the drive circuit as the drive circuit control signal and provided to the converting circuit as the input control signal,
   wherein the temperature compensating circuit comprises a temperature detecting element, an analog-to-digital (A/D) converter for converting a detection signal detected by the temperature detecting element to a digital signal used as an address signal, and a memory for storing temperature data accessed by the address signal from the A/D converter; and
   wherein the optical transmission circuit further comprises an analog-to-digital converter (A/D) connected to the adjusting circuit, a multiplier connected to the A/D converter and a digital-to-analog converter (D/A) connected to the multiplier; the A/D converter converts an output of the adjusting circuit to a digital signal; the multiplier multiplies the digital signal by an output of the memory in the temperature compensating circuit; and the D/A converter converts an output of the multiplier to an analog signal in order to obtain the optical power control signal to be supplied to the drive circuit.

6. An optical transmission circuit as claimed in claim 1, further comprising:

an adjusting circuit supplying an optical power control signal provided to the drive circuit as the drive circuit control signal and provided to the converting circuit as the input control signal, wherein the converting circuit comprises an initial value setting unit; a voltage/current converter for converting the current, which flows based on the optical power control signal from the adjusting circuit, to a voltage; and a linkage adjusting unit for outputting the duty control signal based on the initial setting value from the initial value setting unit in correspondence with an output voltage from the voltage/current converter.

7. An optical transmission circuit as claimed in claim 1, further comprising:

an adjusting circuit supplying an optical power control signal provided to the drive circuit as the drive circuit control signal and provided to the converting circuit as the input control signal, wherein the converting circuit comprises an initial value setting unit; a voltage/current converter for converting the current, which flows based on the optical power control signal from the adjusting circuit, to a voltage; a power fluctuation compensating unit for detecting a fluctuation of power voltage and correcting the output voltage from the voltage/current converter; a voltage/current converter for converting the output voltage of the power fluctuation compensating unit to the current; and a linkage adjusting unit for outputting the duty control signal based on the initial setting value in correspondence with an output voltage of the voltage/current converter.

8. An optical transmission circuit as claimed in claim 1, further comprising:

an adjusting circuit supplying an optical power control signal provided to the drive circuit as the drive circuit control signal and provided to the converting circuit as the input control signal, wherein the converting circuit comprises an initial value setting unit; a voltage/current converter for converting the current, which flows based on the optical power control signal from the adjusting circuit, to a voltage; a resistance value control unit for converting the output voltage of the voltage/current converter to a resistance value control signal; and a linkage adjusting unit for outputting the duty control signal based on the initial setting value in correspondence with the resistance value control signal.

9. An optical transmission circuit as claimed in claim 1, wherein the duty changing circuit is formed by a clock reference type duty changing circuit which receives input data and clock signals, and adjusts the duty value of the input data to be supplied to the drive circuit in accordance with the duty control signal from the converting circuit.

10. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data; and an adjusting circuit connected to the converting circuit and the drive circuit for supplying an optical power control signal to both the converting circuit and the drive circuit, wherein the converting circuit comprises an analog-to-digital (A/D) converter which converts the optical power control signal to a digital signal used as an address signal; a memory accessed by the address signal from the A/D converter and for storing the duty control signal in correspondence with the address signal; and a digital-to-analog (D/A) converter which converts a digital duty control signal read out from the memory to an analog duty control signal in order to supply the analog duty control signal to the duty changing circuit.

11. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data; and an adjusting circuit connected to the converting circuit and the drive circuit for supplying an optical power control signal to both the converting circuit and the drive circuit, wherein the converting circuit converts the optical power control signal, which is supplied from the adjusting circuit to the converting circuit and the drive circuit, to the duty control signal in order to control the optical power of the semiconductor laser in such a manner that when the optical power is increased, the duty value is decreased, and the converting circuit comprises an analog-to-digital (A/D) converter which converts the optical power control signal to a digital signal used as an address signal; a memory accessed by the address signal from the A/D converter and for storing the duty control signal in correspondence with the address signal; and a digital-to-analog (D/A) converter which converts a digital duty control signal read out from the memory to an analog duty control signal in order to supply the analog duty control signal to the duty changing circuit.

12. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data;

an adjusting circuit connected to the converting circuit and the drive circuit for supplying an optical power control signal to both the converting circuit and the drive circuit; and a temperature compensating circuit which is provided between the adjusting circuit and the drive circuit in order to compensate for a temperature characteristic of the semiconductor laser.

13. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data;

an adjusting circuit connected to the converting circuit and the drive circuit for supplying an optical power control signal to both the converting circuit and the drive circuit; and a temperature compensating circuit which is provided between the converting circuit and the duty changing circuit in order to compensate for both the temperature characteristics of the semiconductor laser and the duty changing circuit.

14. An optical transmission circuit as claimed in claim 13, wherein the temperature compensating circuit comprises a temperature detecting element, an analog-to-digital (A/D) converter for converting a detection signal detected by the temperature detecting element to a digital signal used as an address signal, and a memory for storing temperature data accessed by the address signal from the A/D converter; and wherein the optical transmission circuit further comprises an analog-to-digital converter (A/D) connected to the adjusting circuit, a multiplier connected to the A/D converter and a digital-to-analog converter (D/A) connected to the multiplier; the A/D converter converts an output of the adjusting circuit to a digital signal; the multiplier multiplies the digital signal by an output of the memory in the temperature compensating circuit; and the D/A converter converts an output of the multiplier to an analog signal in order to obtain the optical power control signal to be supplied to the drive circuit.

15. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data; and an adjusting circuit connected to the converting circuit and the drive circuit for supplying an optical power control signal to both the converting circuit and the drive circuit, wherein the converting circuit comprises an initial value setting unit; a voltage/current converter for converting the current, which flows based on the optical power control signal from the adjusting circuit, to a voltage; and a linkage adjusting unit for outputting the duty control signal based on the initial setting value from the initial value setting unit in correspondence with an output voltage from the voltage/current converter.

16. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data; and an adjusting circuit connected to the converting circuit and the drive circuit for supplying an optical power control signal to both the converting circuit and the drive circuit, wherein the converting circuit comprises an initial value setting unit; a voltage/current converter for converting the current, which flows based on the optical power control signal from the adjusting circuit, to a voltage; a power fluctuation compensating unit for detecting a fluctuation of power voltage and correcting the output voltage from the voltage/current converter; a voltage/current converter for converting the output voltage of the power fluctuation compensating unit to the current; and a linkage adjusting unit for outputting the duty control signal based on the initial setting value in correspondence with an output voltage of the voltage/current converter.

17. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data; and an adjusting circuit connected to the converting circuit and the drive circuit for supplying an optical power control signal to both the converting circuit and the drive circuit, wherein the converting circuit comprises an initial value setting unit; a voltage/current converter for converting the current, which flows based on the optical power control signal from the adjusting circuit, to a voltage; a resistance value control unit for converting the output voltage of the voltage/current converter to a resistance value control signal; and a linkage adjusting unit for outputting the duty control signal based on the initial setting value in correspondence with the resistance value control signal.

18. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data; and an adjusting circuit connected to the converting circuit and the drive circuit for supplying an optical power control signal to both the converting circuit and the drive circuit, wherein the duty changing circuit is formed by a clock reference type duty changing circuit which receives input data and clock signals, and adjusts the duty value of the input data to be supplied to the drive circuit in accordance with the duty control signal from the converting circuit.

19. An apparatus comprising:

an adjusting circuit producing an optical power control signal;

a converting circuit receiving the optical power control signal and producing a duty control signal from the received optical power control signal;

a duty changing circuit producing a duty value in accordance with the duty control signal; and a drive circuit, receiving the optical power control signal, and driving a semiconductor laser in accordance with the duty value and the received optical power control signal, wherein the adjusting circuit, the converting circuit and the duty changing circuit operate together so that, when the optical power of the semiconductor laser is to be increased, the duty value is decreased, and when the optical power of the semiconductor laser is to be decreased, the duty value is increased, the apparatus thereby providing adjustment of the duty value and optical power of the semiconductor laser in accordance with adjustment of the optical power control signal by the adjusting circuit.

20. An apparatus as in claim 19, further comprising the semiconductor laser.

21. An apparatus comprising:

means for producing an optical power control signal;

means for receiving the optical power control signal and producing a duty control signal from the received optical power control signal;

means for producing a duty value in accordance with the duty control signal; and means for receiving the optical power control signal, and for driving a semiconductor laser in accordance with the duty value and the received optical power control signal, wherein, when the optical power of the semiconductor laser is to be increased, the duty value is decreased, and when the optical power of the semiconductor laser is to be decreased, the duty value is increased, the apparatus thereby providing adjustment of the duty value and optical power of the semiconductor laser in accordance with adjustment of the optical power control signal.

22. An apparatus as in claim 21, further comprising the semiconductor laser.

23. An apparatus comprising:

an adjusting circuit producing an optical power control signal;

a converting circuit receiving the optical power control signal and converting the received optical power control signal into a duty control signal;

a duty changing circuit producing a duty value in accordance with the duty control signal; and a drive circuit, receiving the optical power control signal, and driving a semiconductor laser in accordance with the duty value and the received optical power control signal, wherein the converting circuit converts the optical power control signal received by the converting circuit into a duty control signal so that, when the optical power of the semiconductor laser is to be increased, the duty value is decreased, and when the optical power of the semiconductor laser is to be decreased, the duty value is increased, the apparatus thereby controlling optical power of the semiconductor laser in accordance with the optical power control signal.

24. An apparatus as in claim 23, further comprising the semiconductor laser.

25. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data; and an adjusting circuit for supplying an optical power control signal to both the converting circuit and the drive circuit, wherein the converting circuit converts the optical power control signal to the duty control signal such that, when the optical power is increased, the duty value is decreased, and vice versa, wherein the converting circuit comprises an analog-to-digital (A/D) converter which converts the optical power control signal to a digital signal used as an address signal; a memory accessed by the address signal from the A/D converter and for storing the duty control signal in correspondence with the address signal; and a digital-to-analog (D/A) converter which converts a digital duty control signal read out from the memory to an analog duty control signal in order to supply the analog duty control signal to the duty changing circuit.

26. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data;

an adjusting circuit for supplying an optical power control signal to both the converting circuit and the drive circuit, wherein the converting circuit converts the optical power control signal to the duty control signal such that, when the optical power is increased, the duty value is decreased, and vice versa; and a temperature compensating circuit which is provided between the adjusting circuit and the drive circuit in order to compensate for a temperature characteristic of the semiconductor laser.

27. An optical transmission circuit comprising:

a semiconductor laser;

a drive circuit connected to the semiconductor laser for supplying drive current to the semiconductor laser;

a duty changing circuit connected to the drive circuit for receiving an input data and changing a duty value of the input data;

a converting circuit connected to the duty changing circuit for supplying a duty control signal to the duty changing circuit in order to adjust the duty value of the input data;

an adjusting circuit for supplying an optical power control signal to both the converting circuit and the drive circuit, wherein the converting circuit converts the optical power control signal to the duty control signal such that, when the optical power is increased, the duty value is decreased, and vice versa; and a temperature compensating circuit which is provided between the converting circuit and the duty changing circuit in order to compensate for both the temperature characteristics of the semiconductor laser and the duty changing circuit.

28. An optical transmission circuit as claimed in claim 27, wherein the temperature compensating circuit comprises a temperature detecting element, an analog-to-digital (A/D) converter for converting a detection signal detected by the temperature detecting element to a digital signal used as an address signal, and a memory for storing temperature data accessed by the address signal from the A/D converter; and wherein the optical transmission circuit further comprises an analog-to-digital converter (A/D) connected to the adjusting circuit, a multiplier connected to the A/D converter and a digital-to-analog converter (D/A) connected to the multiplier; the A/D converter converts an output of the adjusting circuit to a digital signal; the multiplier multiplies the digital signal by an output of the memory in the temperature compensating circuit; and the D/A converter converts an output of the multiplier to an analog signal in order to obtain the optical power control signal to be supplied to the drive circuit.

29. An optical transmission circuit comprising:
a semiconductor laser;
a drive circuit connected to the semiconductor laser for supplying drive current to the semiconductor laser;
a duty changing circuit connected to the drive circuit for receiving an input data and changing a duty value of the input data;
a converting circuit connected to the duty changing circuit for supplying a duty control signal to the duty changing circuit in order to adjust the duty value of the input data; and
an adjusting circuit for supplying an optical power control signal to both the converting circuit and the drive circuit, wherein the converting circuit converts the optical power control signal to the duty control signal such that, when the optical power is increased, the duty value is decreased, and vice versa,
wherein the converting circuit comprises an initial value setting unit; a voltage/current converter for converting the current, which flows based on the optical power control signal from the adjusting circuit, to a voltage; and a linkage adjusting unit for outputting the duty control signal based on the initial setting value from the initial value setting unit in correspondence with an output voltage from the voltage/current converter.

30. An optical transmission circuit comprising:
a semiconductor laser;
a drive circuit connected to the semiconductor laser for supplying drive current to the semiconductor laser;
a duty changing circuit connected to the drive circuit for receiving an input data and changing a duty value of the input data;
a converting circuit connected to the duty changing circuit for supplying a duty control signal to the duty changing circuit in order to adjust the duty value of the input data; and
an adjusting circuit for supplying an optical power control signal to both the converting circuit and the drive circuit, wherein the converting circuit converts the optical power control signal to the duty control signal such that, when the optical power is increased, the duty value is decreased, and vice versa,
wherein the converting circuit comprises an initial value setting unit; a voltage/current converter for converting the current, which flows based on the optical power control signal from the adjusting circuit, to a voltage; a power fluctuation compensating unit for detecting a fluctuation of power voltage and correcting the output voltage from the voltage/current converter; a voltage/current converter for converting the output voltage of the power fluctuation compensating unit to the current; and a linkage adjusting unit for outputting the duty control signal based on the initial setting value in correspondence with an output voltage of the voltage/current converter.

31. An optical transmission circuit comprising:
a semiconductor laser;
a drive circuit connected to the semiconductor laser for supplying drive current to the semiconductor laser;
a duty changing circuit connected to the drive circuit for receiving an input data and changing a duty value of the input data;
a converting circuit connected to the duty changing circuit for supplying a duty control signal to the duty changing circuit in order to adjust the duty value of the input data; and
an adjusting circuit for supplying an optical power control signal to both the converting circuit and the drive circuit, wherein the converting circuit converts the optical power control signal to the duty control signal such that, when the optical power is increased, the duty value is decreased, and vice versa,
wherein the converting circuit comprises an initial value setting unit; a voltage/current converter for converting the current, which flows based on the optical power control signal from the adjusting circuit, to a voltage; a resistance value control unit for converting the output voltage of the voltage/current converter to a resistance value control signal; and a linkage adjusting unit for outputting the duty control signal based on the initial setting value in correspondence with the resistance value control signal.

32. An optical transmission circuit comprising:
a semiconductor laser;
a drive circuit connected to the semiconductor laser for supplying drive current to the semiconductor laser;
a duty changing circuit connected to the drive circuit for receiving an input data and changing a duty value of the input data;
a converting circuit connected to the duty changing circuit for supplying a duty control signal to the duty changing circuit in order to adjust the duty value of the input data; and
an adjusting circuit for supplying an optical power control signal to both the converting circuit and the drive circuit, wherein the converting circuit converts the optical power control signal to the duty control signal such that, when the optical power is increased, the duty value is decreased, and vice versa, wherein the duty changing circuit is formed by a clock reference type duty changing circuit which receives input data and clock signals, and adjusts the duty value of the input data to be supplied to the drive circuit in accordance with the duty control signal from the converting circuit.

33. An apparatus comprising:

an adjusting circuit producing an optical power control signal;

a converting circuit receiving the optical power control signal and producing a duty control signal from the received optical power control signal;

a duty changing circuit producing a duty value in accordance with the duty control signal; and a drive circuit, receiving the optical power control signal, and driving a semiconductor laser in accordance with the duty value and the received optical power control signal, wherein the adjusting circuit, the converting circuit and the duty changing circuit operate together so that, when the optical power of the semiconductor laser is to be increased, the optical power control signal produced by the adjusting circuit causes the drive circuit to increase a drive current provided to the semiconductor laser to drive the semiconductor laser, and the duty control signal produced by the converting circuit from the optical power control signal causes the duty value produced by the duty changing circuit to be reduced, and when the optical power of the semiconductor laser is to be decreased, the optical power control signal produced by the adjusting circuit causes the drive circuit to decrease a drive current provided to the semiconductor laser to drive the semiconductor laser, and the duty control signal produced by the converting circuit from the optical power control signal causes the duty value produced by the duty changing circuit to be increased.

* * * * *